US011349008B2

(12) United States Patent
Hsu et al.

(10) Patent No.: US 11,349,008 B2
(45) Date of Patent: May 31, 2022

(54) NEGATIVE CAPACITANCE TRANSISTOR HAVING A MULTILAYER FERROELECTRIC STRUCTURE OR A FERROELECTRIC LAYER WITH A GRADIENT DOPING PROFILE

(71) Applicant: Taiwan Semiconductor Manufacturing Co., Ltd., Hsin-Chu (TW)

(72) Inventors: Chi-Hsing Hsu, New Taipei (TW); Sai-Hooi Yeong, Zhubei (TW); Chih-Yu Chang, New Taipei (TW); Ching-Wei Tsai, Hsinchu (TW); Kuan-Lun Cheng, Hsin-Chu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 16/572,257

(22) Filed: Sep. 16, 2019

(65) Prior Publication Data
US 2020/0105897 A1    Apr. 2, 2020

Related U.S. Application Data

(60) Provisional application No. 62/737,422, filed on Sep. 27, 2018.

(51) Int. Cl.
*H01L 29/51*    (2006.01)
*H01L 21/28*    (2006.01)
(Continued)

(52) U.S. Cl.
CPC ......... *H01L 29/516* (2013.01); *H01L 21/022* (2013.01); *H01L 21/0228* (2013.01); *H01L 21/02178* (2013.01); *H01L 21/02181* (2013.01); *H01L 21/02189* (2013.01); *H01L 21/02194* (2013.01); *H01L 21/28194* (2013.01);
(Continued)

(58) Field of Classification Search
CPC ........................... H01L 29/513; H01L 29/516
See application file for complete search history.

(56) References Cited

U.S. PATENT DOCUMENTS 6,307,225 B1 * 10/2001 Kijima .................. H01L 29/513
257/295
8,520,482 B2    8/2013 Mahnad
(Continued)

OTHER PUBLICATIONS

C. Jiang et al., Analytical drain current model for long-channel gate-all-around negative capacitance transistors with a metal-ferroelectric-insulator-semiconductor structure, Jan. 5, 2016, Japanese J. Applied Physics, vol. 55, No. 024201, all pages. (Year: 2016).*
(Continued)

*Primary Examiner* — Victoria K. Hall
(74) *Attorney, Agent, or Firm* — Haynes and Boone, LLP

(57) ABSTRACT

A negative capacitance semiconductor device includes a substrate. A dielectric layer is disposed over a portion of the substrate. A ferroelectric structure is disposed over the dielectric layer. Within the ferroelectric structure: a material composition of the ferroelectric structure varies as a function of a height within the ferroelectric structure. A gate electrode is disposed over the ferroelectric structure.

20 Claims, 17 Drawing Sheets

(51) Int. Cl.
  *H01L 21/02*   (2006.01)
  *H01L 29/78*   (2006.01)
  *H01L 29/66*   (2006.01)
  *H01L 29/423*  (2006.01)

(52) U.S. Cl.
  CPC .......... *H01L 29/513* (2013.01); *H01L 29/517* (2013.01); *H01L 29/78* (2013.01); *H01L 29/78391* (2014.09); *H01L 29/4232* (2013.01); *H01L 29/66545* (2013.01)

(56) References Cited

U.S. PATENT DOCUMENTS

| | | | |
|---|---|---|---|
| 8,772,109 | B2 | 7/2014 | Colinge |
| 8,785,285 | B2 | 7/2014 | Tsai et al. |
| 8,796,666 | B1 | 8/2014 | Huang et al. |
| 8,815,712 | B2 | 8/2014 | Wan et al. |
| 8,816,444 | B2 | 8/2014 | Wann et al. |
| 8,823,065 | B2 | 9/2014 | Wang et al. |
| 8,836,016 | B2 | 9/2014 | Wu et al. |
| 8,841,701 | B2 | 9/2014 | Lin et al. |
| 8,847,293 | B2 | 9/2014 | Lee et al. |
| 8,853,025 | B2 | 10/2014 | Zhang et al. |
| 8,860,148 | B2 | 10/2014 | Hu et al. |
| 8,962,400 | B2 | 2/2015 | Tsai et al. |
| 8,963,258 | B2 | 2/2015 | Yu et al. |
| 9,093,514 | B2 | 7/2015 | Tsai et al. |
| 9,093,530 | B2 | 7/2015 | Huang et al. |
| 9,105,490 | B2 | 8/2015 | Wang et al. |
| 9,171,929 | B2 | 10/2015 | Lee et al. |
| 9,214,555 | B2 | 12/2015 | Oxland et al. |
| 9,236,267 | B2 | 1/2016 | De et al. |
| 9,236,300 | B2 | 1/2016 | Liaw |
| 9,245,805 | B2 | 1/2016 | Yeh et al. |
| 9,520,482 | B1 | 12/2016 | Chang et al. |
| 9,548,303 | B2 | 1/2017 | Lee et al. |
| 9,576,814 | B2 | 2/2017 | Wu et al. |
| 9,793,397 | B1* | 10/2017 | Ando ................. H01L 29/4966 |
| 10,096,619 | B2* | 10/2018 | Ino .................... H01L 27/11514 |
| 10,153,155 | B2* | 12/2018 | Nishida ............. H01L 21/02356 |
| 10,276,697 | B1* | 4/2019 | Lu ....................... H01L 21/0201 |
| 10,522,564 | B2* | 12/2019 | Yoo .................. H01L 21/02189 |
| 10,861,973 | B2* | 12/2020 | Hsu ....................... H01L 29/517 |
| 11,018,239 | B2* | 5/2021 | Chen ..................... H01L 29/513 |
| 11,222,958 | B2* | 1/2022 | Hsu ................. H01L 21/823878 |
| 2002/0135030 | A1* | 9/2002 | Horikawa ............. H01L 29/513 257/405 |
| 2002/0195643 | A1* | 12/2002 | Harada ............. H01L 21/28202 257/310 |
| 2007/0004049 | A1* | 1/2007 | Nasu ................... H01L 29/7881 438/3 |
| 2008/0032424 | A1* | 2/2008 | Ahn .................... H01L 21/3142 438/3 |
| 2010/0302705 | A1* | 12/2010 | Antonov .............. H01G 4/1209 361/313 |
| 2013/0285116 | A1* | 10/2013 | Lochtefeld ........ H01L 21/02381 257/190 |
| 2014/0070289 | A1* | 3/2014 | Tanaka ............. H01L 29/40111 257/295 |
| 2015/0357429 | A1* | 12/2015 | Dubourdieu .......... H01L 29/516 257/295 |
| 2016/0005961 | A1* | 1/2016 | Ino .......................... H01L 45/06 257/4 |
| 2016/0064655 | A1* | 3/2016 | Tao ....................... H01L 45/147 257/4 |
| 2016/0065655 | A1* | 3/2016 | Bentley ................. H04L 67/10 709/201 |
| 2016/0133753 | A1* | 5/2016 | Dubourdieu ...... H01L 29/78391 257/295 |
| 2016/0365133 | A1* | 12/2016 | Ino ......................... G11C 11/223 |
| 2017/0141235 | A1* | 5/2017 | Lai ........................ H01L 29/401 |
| 2018/0090591 | A1* | 3/2018 | Ando .................... H01L 29/516 |
| 2018/0240803 | A1* | 8/2018 | Yoo .................... H01L 21/02181 |
| 2018/0240804 | A1* | 8/2018 | Yoo ....................... H01L 29/516 |
| 2018/0277212 | A1* | 9/2018 | Kim ....................... H01L 29/408 |
| 2018/0277550 | A1* | 9/2018 | Yoo ..................... G11C 11/2275 |
| 2018/0315859 | A1* | 11/2018 | Ramaswamy .... H01L 27/11521 |
| 2018/0366476 | A1* | 12/2018 | Liu ...................... H01L 21/0228 |
| 2019/0019800 | A1* | 1/2019 | Yoo .................... H01L 29/40111 |
| 2019/0019801 | A1* | 1/2019 | Yoo ........................ H01L 29/513 |
| 2019/0057860 | A1* | 2/2019 | Yoon ..................... H01L 29/516 |
| 2019/0115461 | A1* | 4/2019 | Yonehara .......... H01L 29/78391 |
| 2019/0296122 | A1* | 9/2019 | Ino .................... H01L 27/11597 |
| 2019/0319108 | A1* | 10/2019 | Kittl ..................... H01L 27/088 |
| 2019/0393355 | A1* | 12/2019 | Yoo ....................... H01L 29/518 |
| 2020/0091306 | A1* | 3/2020 | Heo ....................... H01L 29/778 |
| 2020/0235243 | A1* | 7/2020 | Avci ...................... H01L 29/785 |

OTHER PUBLICATIONS

F. Ambriz-Vargas et al., A Complementary Metal Oxide Semiconductor Process-Compatible Ferroelectric Tunnel Junction, Apr. 3, 2017, Applied Materials & Interfaces, vol. 9, p. 13262-13268 (Year: 2017).*

Müller, Johannes et al., "Ferroelectricity in Simple Binary $ZrO_2$ and $HfO_2$," dx.doi.org, 10.1021, nl302049k, Nano Lett., 2012, 12, pp. 4318-4323, ACS Publications.

* cited by examiner

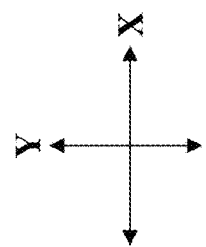
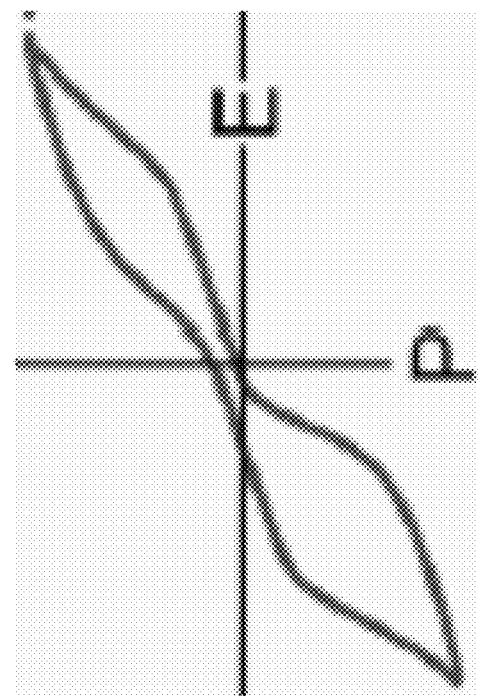
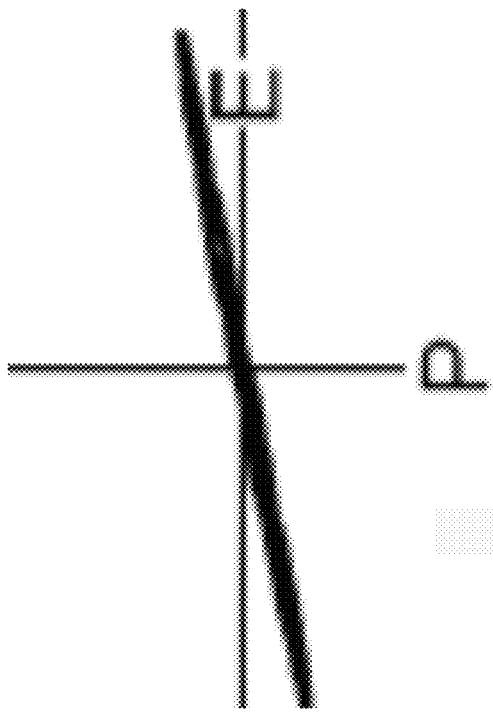

NEGATIVE CAPACITANCE TRANSISTOR HAVING A MULTILAYER FERROELECTRIC STRUCTURE OR A FERROELECTRIC LAYER WITH A GRADIENT DOPING PROFILE

PRIORITY DATA

This application claims priority to U.S. Provisional Patent Application Ser. No. 62/737,422 entitled "Negative Capacitance Transistor with Multilayer and Gradient Doping Profile" and filed on Sep. 27, 2018, the entire disclosure of which is incorporated herein by reference.

BACKGROUND

The semiconductor integrated circuit (IC) industry has experienced rapid growth. Technological advances in IC design and material have produced generations of ICs where each generation has smaller and more complex circuits than previous generations. In the course of IC evolution, functional density (i.e., the number of interconnected devices per chip area) has generally increased while geometry size (i.e., the smallest component (or line) that can be created using a fabrication process) has decreased.

Transistors are circuit components or elements that are often formed on semiconductor devices. Many transistors may be formed on a semiconductor device in addition to capacitors, inductors, resistors, diodes, conductive lines, or other elements, depending on the circuit design. A field effect transistor (FET) is one type of transistor. Generally, a transistor includes a gate stack formed between source and drain regions. The source and drain regions may include a doped region of a substrate and may exhibit a doping profile suitable for a particular application. The gate stack is positioned over the channel region and may include a gate dielectric interposed between a gate electrode and the channel region in the substrate. To improve performance, negative capacitance transistors may be created by forming a gate dielectric having a ferroelectric material. However, existing methods and devices for forming the ferroelectric material may still need improvements.

Therefore, although existing methods of fabricating negative capacitance devices have been generally adequate for their intended purposes, they have not been entirely satisfactory in all respects.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 9A, 9B, and 9C illustrate remanent polarization versus coercive field plots of various materials.

DETAILED DESCRIPTION

Figure 1:
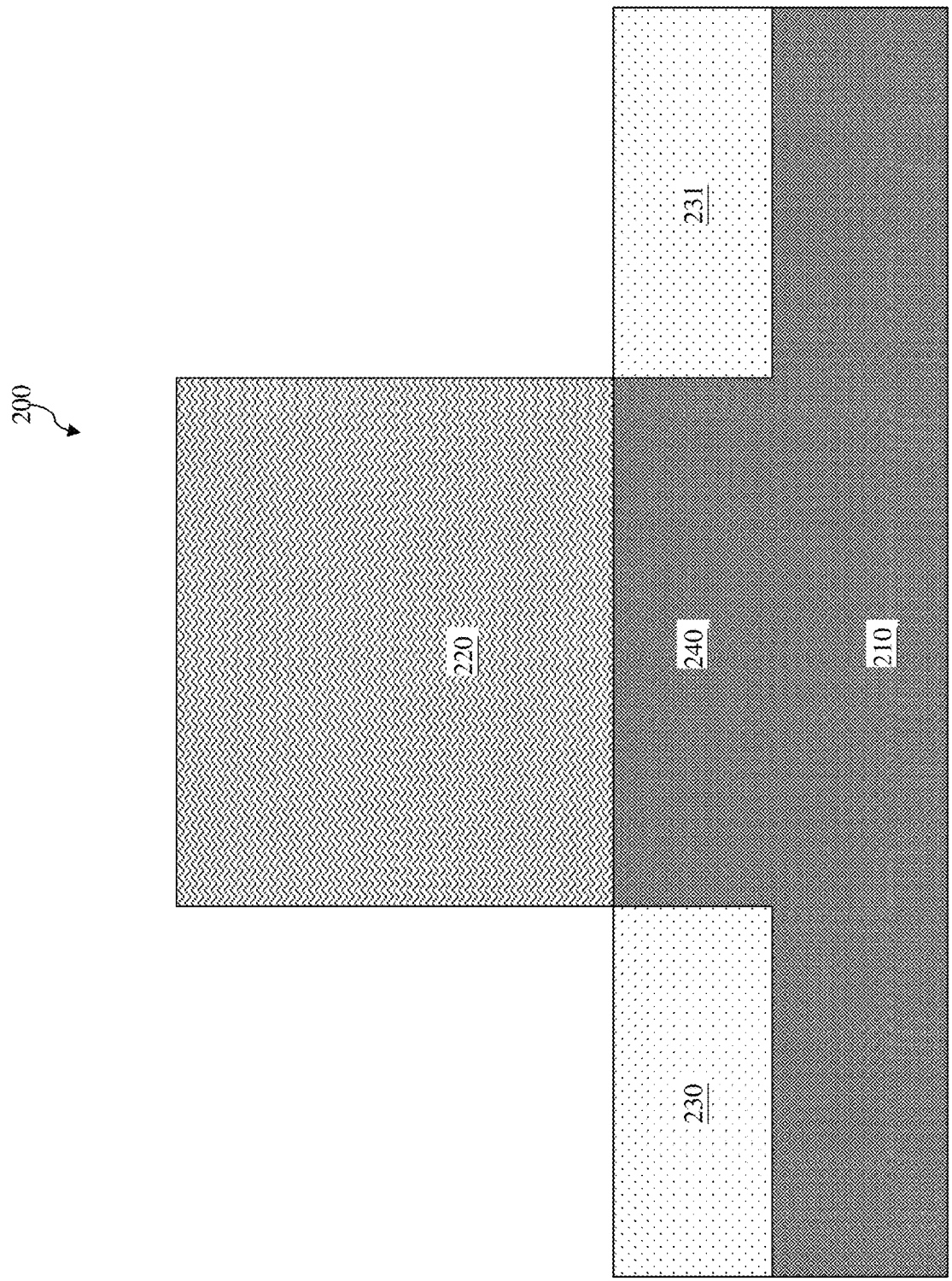
FIGS. 1-7 are cross-sectional views of an example semiconductor device in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. Still further, when a number or a range of numbers is described with "about," "approximate," and the like, the term is intended to encompass numbers that are within a reasonable range including the number described, such as within +/−10% of the number described or other values as understood by person skilled in the art. For example, the term "about 5 nm" encompasses the dimension range from 4.5 nm to 5.5 nm.

Integrated Circuit (IC) devices have been evolving rapidly over the last several decades. A typical IC chip may include numerous active devices such as transistors and passive devices such as resistors, inductors, and capacitors. Recently, negative capacitance devices have been made at least in part via the fabrication of field effect transistors (FETs). In more detail, a negative capacitance device may be formed using a gate structure of a FET device that includes a ferroelectric film. Negative capacitance devices may offer advantages, such as lower subthreshold swing.

Subthreshold swing represents the ease of switching the transistor current off and on and is a factor in determining the switching speed of a FET device. Subthreshold swing allows for FET devices having higher switching speed compared to conventional FET devices. Negative capacitance devices may be utilized in application in metal-oxide-semiconductor field-effect transistors (MOSFETs) with very short channel length for ultra-low power computing. However, negative capacitance devices are often constrained by a small capacitance matching window. With a single layer of ferroelectric material, it is often difficult to design a ferroelectric structure that provides the desired capacitance value.

To overcome the problems discussed above, the present disclosure pertains to a negative capacitance device having improved performance as well as flexible capacitance tuning. For example, the present disclosure implements a gate structure (e.g., of a FET) that includes: a dielectric layer, a ferroelectric structure disposed over the dielectric layer, and a metal gate electrode disposed over the ferroelectric structure. In some embodiments, the ferroelectric structure includes a plurality of ferroelectric layers that each has its own material composition. For example, some of the ferroelectric layers may be undoped, while others may be doped. The doped ferroelectric layers may also be doped with different types of dopants and/or with different dopant concentration levels. In other embodiments, the ferroelectric structure may include a single ferroelectric layer, but the single ferroelectric layer may have a gradient doping profile. For example, the dopant concentration level within the single ferroelectric layer may vary as a function of the depth or height within the ferroelectric layer. In some implementations, the dopant concentration level may be the highest near a middle portion of the single ferroelectric layer and gradually decreases near a top portion or a bottom portion of the ferroelectric layer. In some other implementations, the dopant concentration level may be the highest near a bottom portion of the single ferroelectric layer and gradually decreases away from the bottom portion. These designs of the ferroelectric structure allow the negative capacitor device to have more versatility in tuning the capacitance of the negative capacitance transistor. Consequently, the present disclosure can widen a capacitance matching window of the negative capacitance transistor. The various aspects of the present disclosure are now discussed in more detail below with reference to FIGS. 1-17.

FIGS. 1-7 are diagrammatic fragmentary cross-sectional side views of a semiconductor device 200 at various stages of fabrication in accordance with some embodiments. Referring now to FIG. 1, the semiconductor structure 200 includes a substrate 210. The substrate 210 includes silicon in some embodiments. Alternatively or additionally, the substrate 210 may include other elementary semiconductor such as germanium. The substrate 210 may also include a compound semiconductor such as silicon carbide, gallium arsenic, indium arsenide, and indium phosphide. The substrate 210 may also include an alloy semiconductor such as silicon germanium, silicon germanium carbide, gallium arsenic phosphide, and gallium indium phosphide. In one embodiment, the substrate 210 includes an epitaxial layer. For example, the substrate 210 may have an epitaxial layer overlying a bulk semiconductor. Furthermore, the substrate 210 may include a semiconductor-on-insulator (SOI) structure. For example, the substrate 210 may include a buried oxide (BOX) layer formed by a process such as separation by implanted oxygen (SIMOX) or other suitable technique, such as wafer bonding and grinding.

The substrate 210 may also include various p-type doped regions and/or n-type doped regions, implemented by a process such as ion implantation and/or diffusion. Those doped regions include n-well, p-well, light doped region (LDD) and various channel doping profiles configured to form various integrated circuit (IC) devices, such as a complimentary metal-oxide-semiconductor field-effect transistor (CMOSFET), imaging sensor, and/or light emitting diode (LED).

The substrate 210 may also include various electrical isolation regions. The electrical isolation regions provide electrical isolation between various device regions (such as the doped regions) in the substrate 210. The electrical isolation regions may include different structures formed by using different processing technologies. For example, the electrical isolation regions may include shallow trench isolation (STI) structures. The formation of an STI structure may include etching a trench in the substrate 210 and filling in the trench with one or more insulator materials such as silicon oxide, silicon nitride, silicon oxynitride, or combinations thereof. The filled trench may have a multi-layer structure such as a thermal oxide liner layer with silicon nitride filling the trench. A polishing or planarization process such as chemical mechanical polishing (CMP) may be performed to polish back excessive insulator materials and planarize the top surface of the isolation features.

A dummy gate structure 220 is formed over a portion of the substrate 210. In some embodiments, the dummy gate structure 220 includes a dummy gate dielectric and a dummy gate electrode. The dummy gate dielectric may include silicon oxide, and the dummy gate electrode may include polysilicon. The dummy gate structure 220 may be formed by forming a dummy gate dielectric layer and a dummy gate electrode layer and pattern the dummy gate dielectric layer and the dummy gate electrode layer. The dummy gate structure 220 may further include gate spacers formed on sidewalls of the dummy gate electrode and the dummy gate dielectric. For reasons of simplicity, the gate spacers are not specifically illustrated herein.

Source/drain regions are then formed on opposite sides of the dummy gate structure 220. For example, a source region 230 is formed in the substrate 210 and on the "left" side of the dummy gate structure 220 in FIG. 1, and a drain region 231 is formed in the substrate 210 and on the "right" side of the dummy gate structure 220 in FIG. 1. The source region 230 and the drain region 231 may be formed by one or more ion implantation processes, in which N-type or P-type dopant ions are implanted in the substrate 210, depending on the type of substrate 210 and the type of transistor desired (e.g., NFET or PFET). A channel region 240 is defined as a portion of the substrate 210 that is located between the source region 230 and the drain region 231. It is understood that the source region 230, the drain region 231, and the channel region 240 are components of a negative capacitance FET device. It is also understood that the source region 230 and the drain region 231 may be separated from adjacent doped features (e.g., other source/drain regions of nearby transistors) by electrical isolation regions such as STIs.

Figure 2:
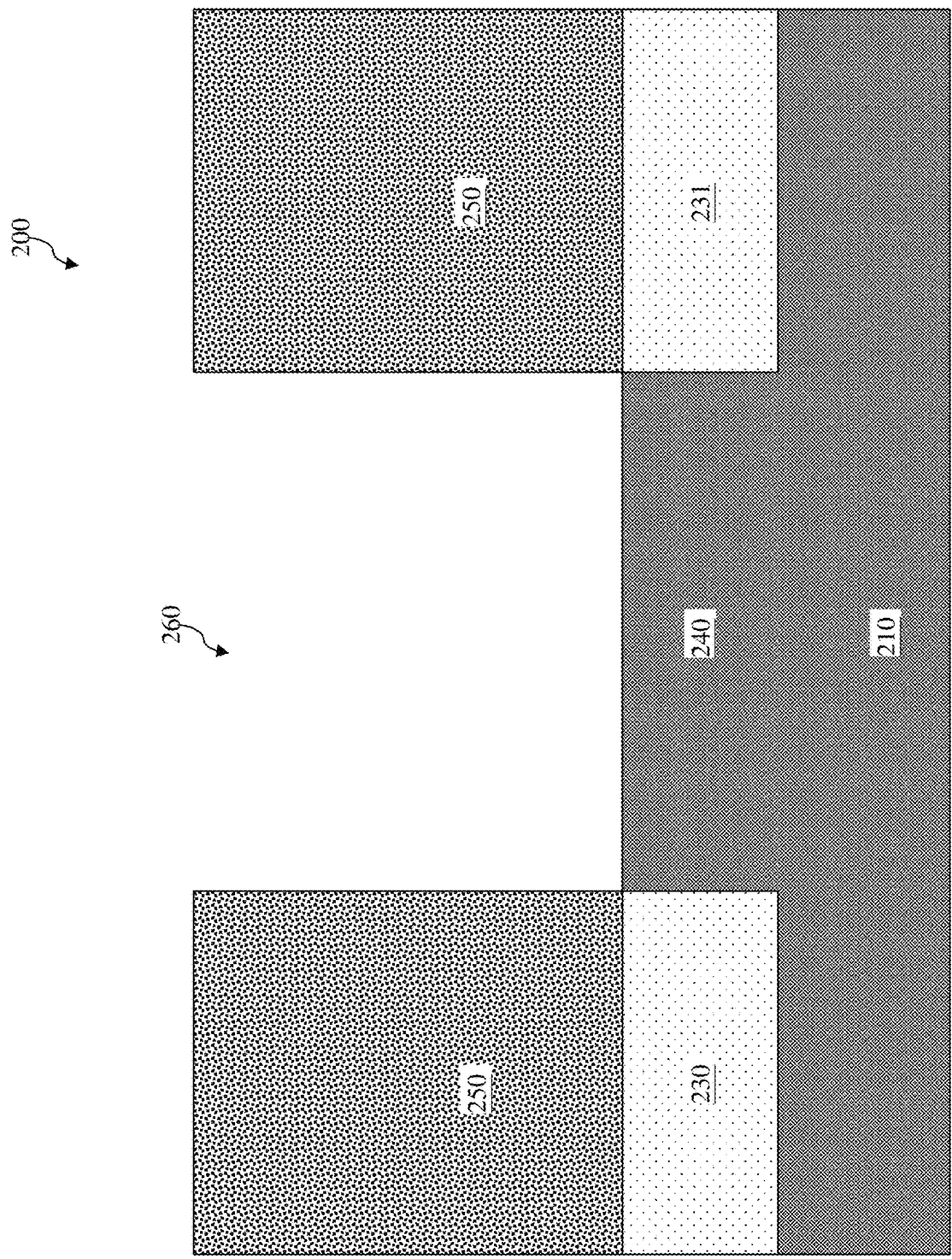

Referring now to FIG. 2, an interlayer dielectric (ILD) 250 is formed over the source and drain regions 230-231 and around the dummy gate structure 220. In some embodiments, the ILD 250 includes a dielectric material, such as a low-k dielectric material (a dielectric material with a dielectric constant smaller than that of silicon dioxide). As non-limiting examples, the low-k dielectric material may include fluorine-doped silicon dioxide, carbon-doped silicon dioxide, porous silicon dioxide, porous carbon-doped silicon dioxide, spin-on organic polymeric dielectrics, spin-on silicon based polymeric dielectrics, or combinations thereof. Alternatively, the ILD 250 may include silicon oxide or silicon nitride, or combinations thereof. The dummy gate structure 220 is then removed to form an opening 260 in place of the removed dummy gate structure 220. As a part of a gate replacement process, the opening 260 will be filled by a functional gate structure that includes a high-k gate dielectric and a metal gate electrode, as well as a ferroelectric structure, as discussed below in more detail.

Figure 3:
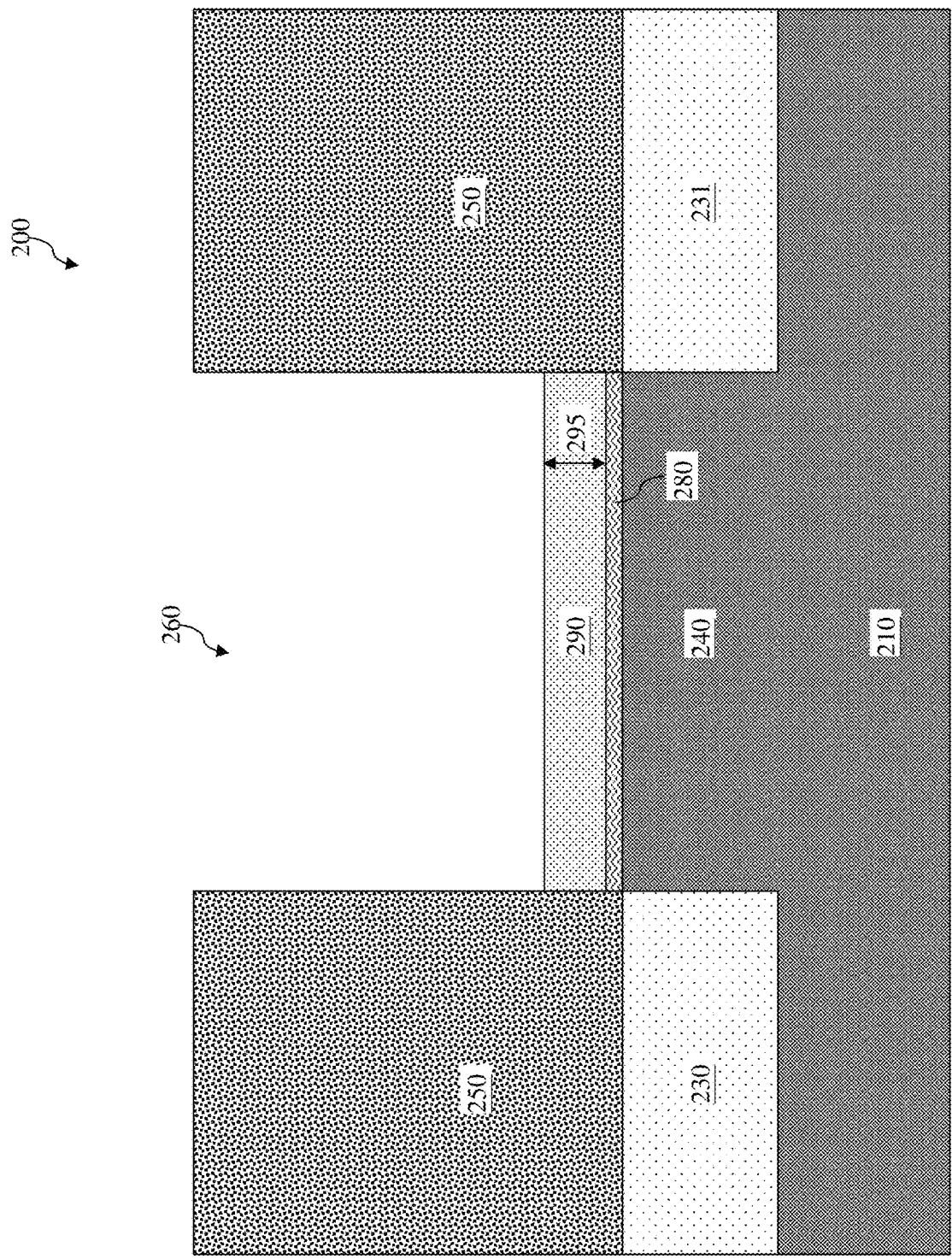

Referring now to FIG. 3, an interfacial layer 280 is formed over the channel region 240 in the opening 260. In some embodiments, the interfacial layer 280 includes an oxide material such as silicon oxide. The interfacial layer 280 serves as an interface between the channel and the gate structure (to be formed by the subsequent processes).

In some embodiments, a layer 290 may be optionally formed in the opening 260 and over the interfacial layer 280. In some embodiments, the layer 290 may include a high-k dielectric material and may be referred to as a high-k dielectric layer 290. Such a high-k dielectric layer 290 may serve as a part of a gate dielectric component of a high-k metal gate (HKMG) structure. In some embodiments, the high-k dielectric layer 290 may include a material having a dielectric constant that is greater than a dielectric constant of $SiO_2$, which is approximately 4. In an embodiment, the high-k dielectric layer 290 includes hafnium oxide ($HfO_2$), which has a dielectric constant that is in a range from approximately 18 to approximately 40. In alternative embodiments, the high-k gate dielectric may include $ZrO_2$, $Y_2O_3$, $La_2O_5$, $Gd_2O_5$, $TiO_2$, $Ta_2O_5$, HfErO, HfLaO, HfYO, HfGdO, HfAlO, HfZrO, HfTiO, HfTaO, or SrTiO. It is understood that in some alternative embodiments, the layer 290 may be formed as a ferroelectric layer.

The formation of the high-k dielectric layer 290 may involve a suitable deposition process. In some embodiments, the deposition process includes an atomic layer deposition (ALD) process, which may be performed in a temperature range from about 200 degrees Celsius and about 400 degrees Celsius. The mechanism of the ALD process may help control a thickness 295 of the high-k dielectric layer 290 with better precision and uniformity, and a relatively low process temperature (e.g., compare to other types of deposition processes) of the ALD process helps the fabrication of the semiconductor device 200 stay within a specified thermal budget. However, the deposition used to form the high-k dielectric layer 290 is not limited to ALD. For example, in other embodiments, the high-k dielectric layers 290 may be formed by deposition processes such a chemical vapor deposition (CVD), plasma enhanced chemical vapor deposition (PECVD), metal-organic chemical vapor deposition (MOCVD), physical vapor deposition (PVD), etc.

Figure 4:
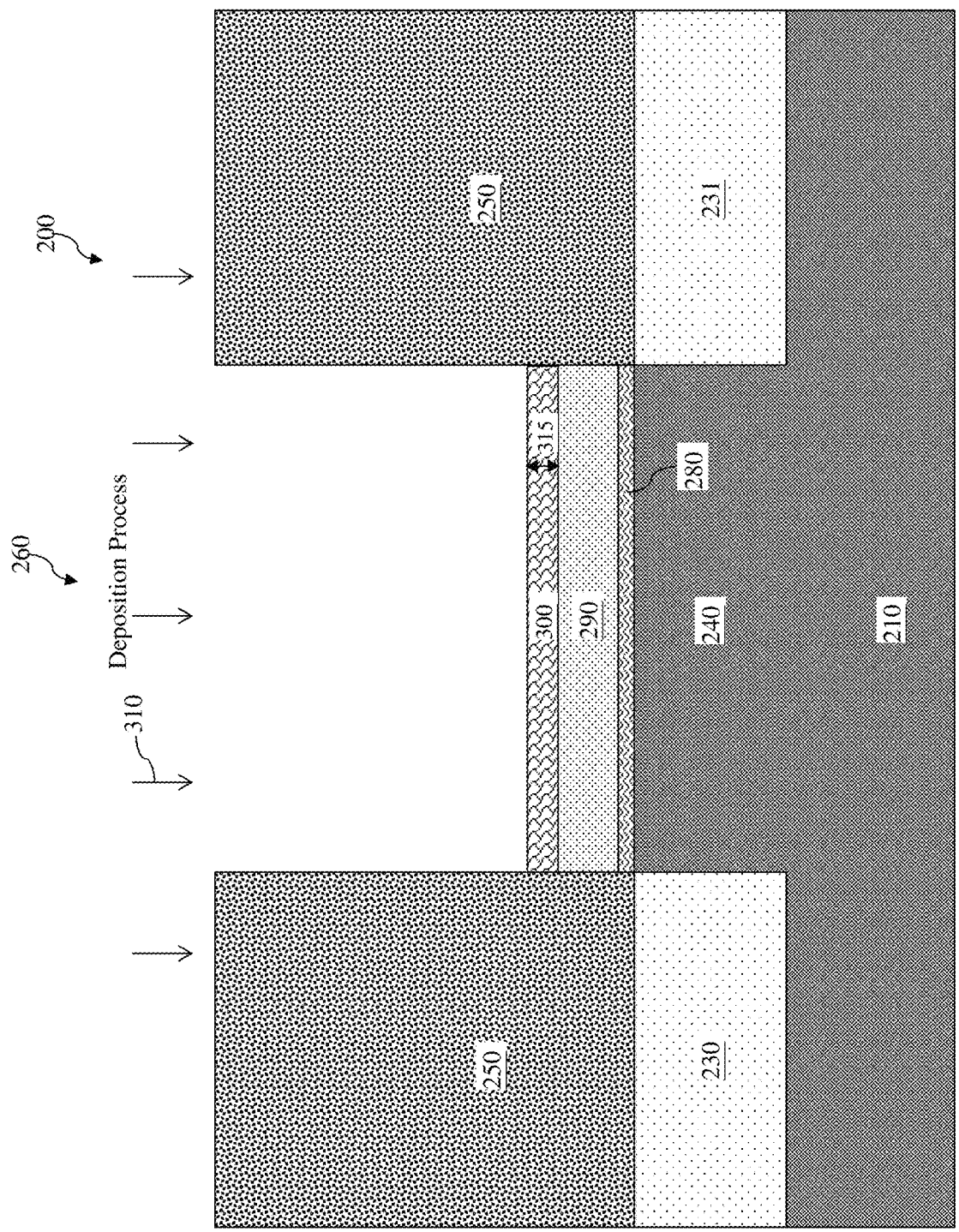

Referring now to FIG. 4, a ferroelectric layer 300 is formed in the opening 260 and over the high-k dielectric layer 290 (or over the interfacial layer 280 if the high-k dielectric layer 290 is absent). The ferroelectric layer 300 may also serve as a part of a gate dielectric of the HKMG and it may be formed by a deposition process 310. In some embodiments, the deposition process 310 includes an ALD process, which allows a thickness and a material composition of the ferroelectric layer 300 to be controlled with better precision and improved uniformity. For example, a thickness 315 of the ferroelectric layer 300 is configured (e.g., by the deposition process 310) to be in a range from about 1.5 nm to about 8 nm. Within this thickness range, the ferroelectric layer 300 is optimized to achieve negative capacitance and/or amplify a gate voltage. In some embodiments, the ALD process of the deposition process 310 may be performed at a temperature range between about 200 degrees Celsius and about 400 degrees Celsius. This temperature range is configured to facilitate the formation of the ferroelectric layer 300. The ALD process is also performed using a first thermal budget, which is a product of a process temperature and a process duration (e.g., the process temperature multiplied by the process duration). In other embodiments, other types of deposition such as CVD, PECVD, MOCVD, or PVD may be used to form the ferroelectric layer 300.

In some embodiments, the ferroelectric layer 300 is formed to have an undoped hafnium zirconium oxide material composition. In other embodiments, the ferroelectric layer 300 may be formed to include a doped material, for example HfO-doped Al. The material composition of the ferroelectric layer 300 is specifically configured to be able to achieve a ferroelectric crystalline phase on amorphous dielectric layers. In some embodiments, the hafnium oxide of the ferroelectric layer 300 is formed to have an orthorhombic crystallographic phase Pbc21. Such a material composition allows the ferroelectric layer 300 to have a good interface with the layer therebelow (e.g., with the high-k dielectric layer 290 or with the interfacial layer 280 if the high-k dielectric layer 290 is absent). For example, the orthorhombic crystallographic phase Pbc21 of the ferroelectric layer 300 helps to reduce intermixing with the layer 290 or the layer 280 therebelow. In alternative embodiments, other types of ferroelectric materials may be used to implement the ferroelectric layer 300, for example hafnium silicon oxide, hafnium aluminum oxide, lead zirconium titanium oxide, or barium titanium oxide, or combinations thereof.

Figure 5:
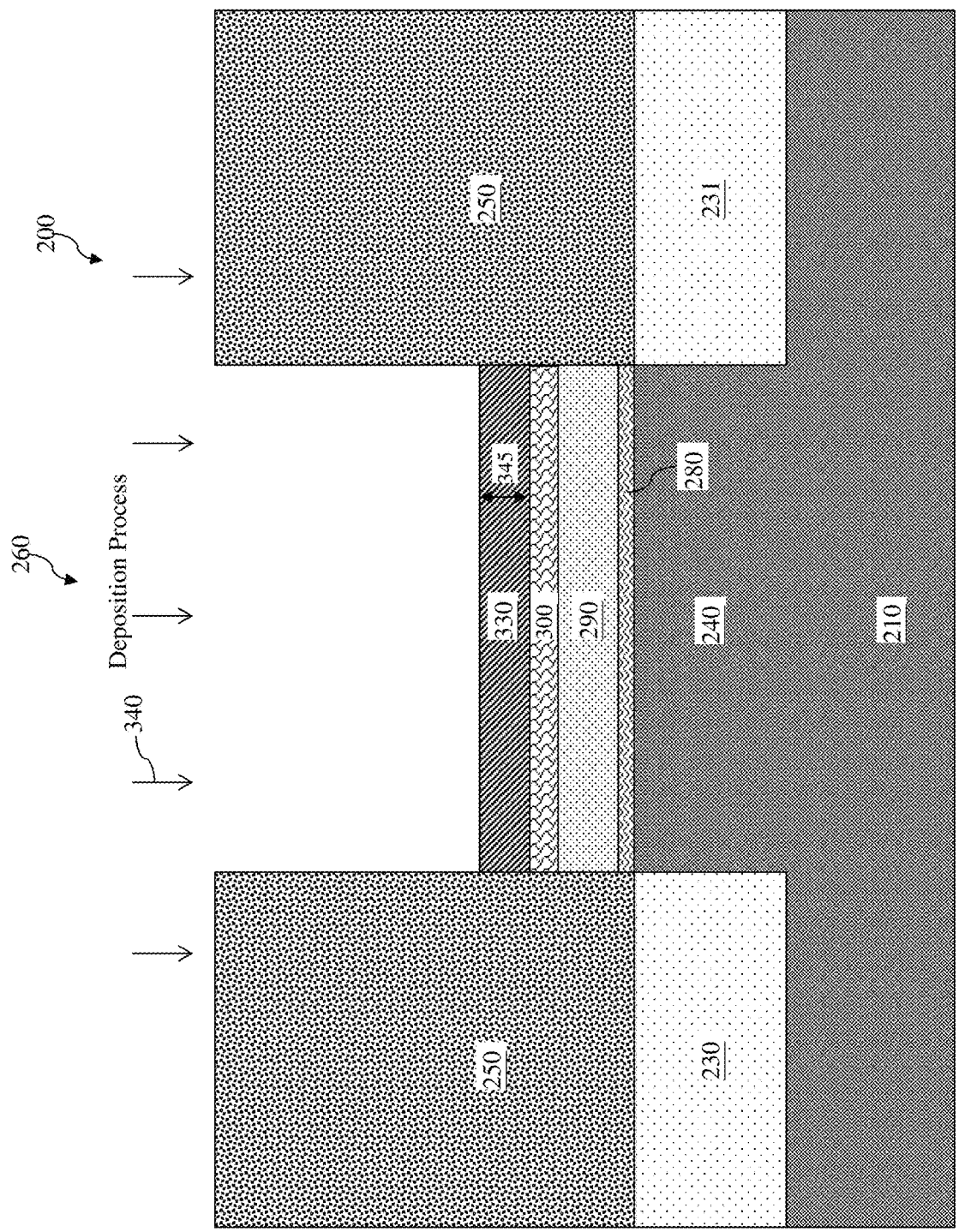

Referring now to FIG. 5, a ferroelectric layer 330 is formed in the opening 260 and over the ferroelectric layer 300. The ferroelectric layer 330 may also serve as a part of a gate dielectric of the HKMG. The ferroelectric layer 330 may be formed by a deposition process 340. In some embodiments, the deposition process 340 includes an ALD process, which as discussed above allows a thickness and a material composition of the ferroelectric layer 330 to be controlled with better precision and improved uniformity. In some embodiments, a thickness 345 of the ferroelectric layer 330 is configured (e.g., by the deposition process 310) to be in a range from about 1 nm to about 2 nm. Within this thickness range, the ferroelectric layer 330 is optimized to achieve negative capacitance and/or amplify a gate voltage. In some embodiments, the ALD process of the deposition process 340 may be performed at a temperature range between about 200 degrees Celsius and about 400 degrees Celsius. This temperature range is configured to facilitate the formation of the ferroelectric layer 330. The ALD process is also performed using a second thermal budget. In some embodiments, the second thermal budget is less than the first thermal budget (used to form the ferroelectric layer 300), in order to improve the quality of the ferroelectric layers 300 and 330 formed. In other embodiments, other types of deposition such as CVD, PECVD, MOCVD, or PVD may be used to form the ferroelectric layer 330.

In some embodiments, the ferroelectric layer 330 is formed to have a doped hafnium aluminum oxide material composition. In other words, the ferroelectric layer 330 may include hafnium oxide that is doped with an aluminum dopant. In some embodiments, the concentration of the aluminum dopant is in a range between about 1% and about 10%, for example between about 3% and about 5%. In some embodiments, the concentration may be measured in terms of molar mass. For example, the percentage of the dopant concentration may be expressed as a mole fraction or a molar fraction. This dopant concentration level range helps to optimize the capacitance tuning properties of the ferroelectric layer 330.

The material composition (including the dopant type and the dopant concentration level) of the ferroelectric layer 330 is specifically configured to achieve a desired tuning range for negative capacitance matching. For example, the presence of the ferroelectric layer 330 may offer an additional degree of freedom in tuning the negative capacitance, and the material composition of the ferroelectric layer 330 is configured to maximize the negative capacitance range that is tunable. However, it is understood that other types of ferroelectric materials and other types of dopants may still be used to implement the ferroelectric layer 330 in alternative embodiments. As non-limiting examples, the other types of ferroelectric materials may include hafnium silicon oxide, lead zirconium titanium oxide, or barium titanium oxide, and the other types of dopants may include zirconium (Zr), silicon (Si), lead (Pb), barium (B a), or titanium (Ti).

Figure 6:
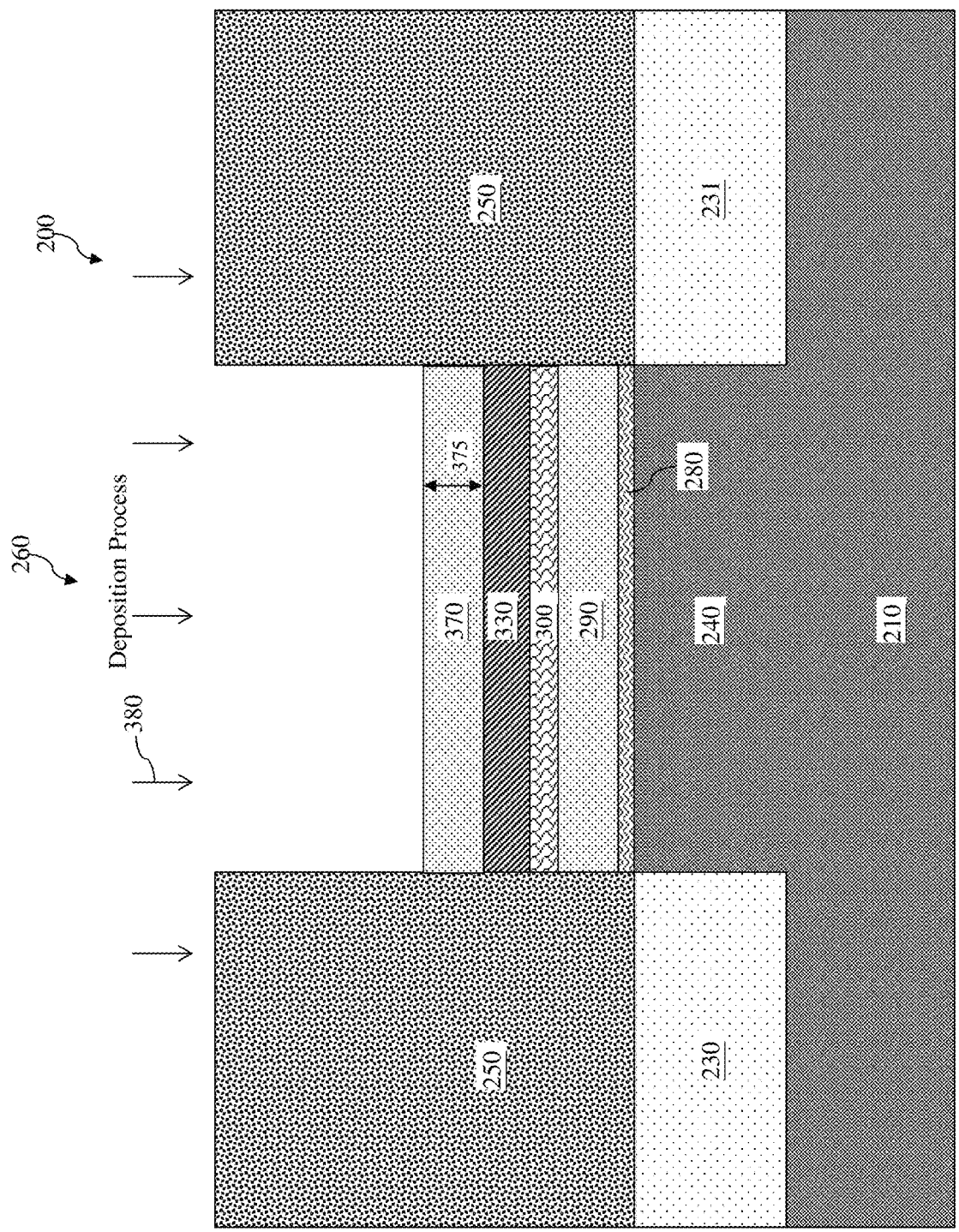

Referring now to FIG. 6, a ferroelectric layer 370 is formed in the opening 260 and over the ferroelectric layer 300. Like the ferroelectric layers 300 and 330, the ferroelectric layer 370 may also serve as a part of a gate dielectric of the HKMG. The ferroelectric layer 370 may be formed by a deposition process 380. In some embodiments, the deposition process 380 includes an ALD process, which as discussed above allows a thickness and a material composition of the ferroelectric layer 370 to be controlled with better precision and improved uniformity. In some embodiments, a thickness 375 of the ferroelectric layer 370 is configured (e.g., by the deposition process 380) to be in a range from about 1.5 nm to about 5 nm. Within this thickness range, the ferroelectric layer 370 is optimized to achieve negative capacitance and/or amplify a gate voltage. In some embodiments, the ALD process of the deposition process 380 may be performed at a temperature range between about 200 degrees Celsius and about 400 degrees Celsius. This temperature range is configured to facilitate the formation of the ferroelectric layer 370. The ALD process is also performed using a third thermal budget. In some embodiments, the third thermal budget is less than the second thermal budget and less than the first thermal budget, in order to improve the quality of the ferroelectric layers 300, 330, and 370 formed. In other embodiments, other types of deposition such as CVD, PECVD, MOCVD, or PVD may be used to form the ferroelectric layer 370.

In some embodiments, the ferroelectric layer 370 is formed to have a doped hafnium zirconium oxide material composition. In other words, the ferroelectric layer 370 may include hafnium oxide that is doped with a zirconium dopant. In some embodiments, the concentration of the zirconium dopant is in a range between about 20% and about 70%, for example between about 45% and about 55%. In some embodiments, the concentration may be measured in terms of molar mass. For example, the percentage of the dopant concentration may be expressed as a mole fraction or a molar fraction. This dopant concentration level range helps to optimize the capacitance tuning properties of the ferroelectric layer 370.

The material composition (including the dopant type and the dopant concentration level) of the ferroelectric layer 370 is specifically configured to achieve a desired tuning range for negative capacitance matching. For example, the presence of the ferroelectric layer 370 may offer an additional degree of freedom in tuning the negative capacitance, and the material composition of the ferroelectric layer 370 is configured to maximize the negative capacitance range that is tunable. In addition, the material composition of the ferroelectric layer 370 is also specifically configured to form a good interface with the layers to be formed thereabove (e.g., a metal gate electrode), for example to reduce the intermixing of materials between the ferroelectric layer 370 and a metal gate electrode to be formed over the ferroelectric layer 370.

However, it is understood that other types of ferroelectric materials and other types of dopants may still be used to implement the ferroelectric layer 370 in alternative embodiments. As non-limiting examples, the other types of ferroelectric materials may include hafnium silicon oxide, hafnium aluminum oxide, or barium titanium oxide, and the other types of dopants may include silicon (Si), aluminum (Al), lead (Pb), barium (Ba), or titanium (Ti), etc. It is also understood that following the depositing of each of the ferroelectric layers 300, 330, or 370, or after the deposition of the ferroelectric layer 370, one or more annealing processes may be performed to the semiconductor device 200.

Figure 7:
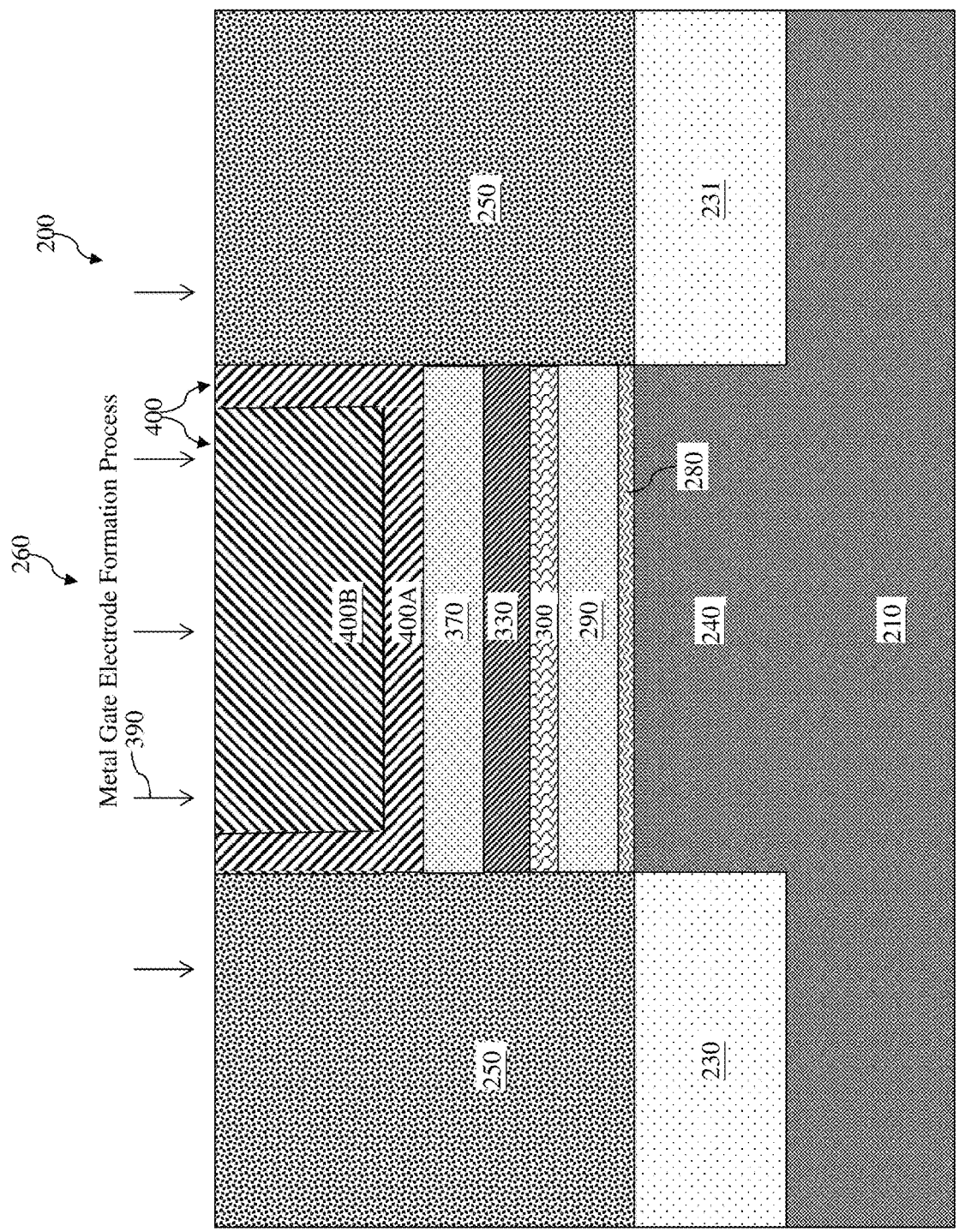

Referring now to FIG. 7, a metal gate electrode formation process 390 is performed to form a metal gate electrode 400 in the opening 260. The metal gate electrode formation process 390 may include a plurality of deposition processes, for example chemical vapor deposition (CVD), atomic layer deposition (ALD), physical vapor deposition (PVD), or combinations thereof. The metal gate electrode 400 may include a work function metal component 400A and a fill metal component 400B. The work functional metal component is configured to tune a work function of its corresponding transistor to achieve a desired threshold voltage Vt. In various embodiments, the work function metal component may contain: TiAl, TiAlN, TaCN, TiN, WN, or W, or combinations thereof. The fill metal component is configured to serve as the main conductive portion of the functional gate structure. In various embodiments, the fill metal component may contain Aluminum (Al), Tungsten (W), Copper (Cu), or combinations thereof.

It is understood that in some embodiments (such as in the illustrated embodiment), the work function metal component 400A of the metal gate electrode 400 formed in the opening 260 may have a "U-shape" cross-sectional profile. For example, the work function metal component 400A may be formed on the sidewalls of the opening 260 and on the ferroelectric layer 370 and therefore has a U-shape. The fill metal component 400B may be formed over the work function metal component 400A.

The metal gate electrode formation process 390 may also include one or more annealing processes. For example, in some embodiments, the work function metal component 400A and/or the fill metal component 400B may include a plurality of metal layers. A respective annealing process may be performed after the deposition of each metal layer of the metal gate electrode 400, or they may be performed after the deposition of all the metal layers of the metal gate electrode 400. The purposes of these annealing processes may include (but are not limited to): lowering interface defects, crystallizing amorphous films, or adjusting or tuning threshold voltages (for example, for better chip reliability).

It is understood that additional fabrication processes may be performed to complete the fabrication of the semiconductor device 200. For example, a multi-layered interconnect structure may be formed to provide electrical interconnections to the various components of the semiconductor device 200. Other processes such as testing or packaging may also be performed. These additional processes are also not specifically illustrated herein for reasons of simplicity.

The fabrication processes discussed above in association with FIGS. 1-7 correspond to a first embodiment of the present disclosure, in which a multilayer ferroelectric structure is formed by the plurality of ferroelectric layers 300, 330, and 370 collectively. The implementation of multiple ferroelectric layers allows additional degrees of freedom in tuning the negative capacitance, as each ferroelectric layer may provide its own negative capacitance tuning characteristic or capability. It is also understood that although three ferroelectric layers are used to implement the multilayer ferroelectric structure, this is just a non-limiting example. In other embodiments, the multilayer ferroelectric structure may be implemented using just two ferroelectric layers, or more than three ferroelectric layers.

Regardless of the embodiment, one unique physical characteristic of the multilayer ferroelectric structure is that within it, the material composition may vary as a function of its depth or height. For example, at a lower portion (e.g., at a deeper depth or a small height) within the multilayer ferroelectric structure, the material composition is that of the ferroelectric layer 300, which as discussed above may be implemented using an undoped hafnium oxide as an example. At a middle portion (e.g., a shallower depth or a greater height) within the multilayer ferroelectric structure, the material composition is that of the ferroelectric layer 330, which as discussed above may be implemented using hafnium oxide that is doped with aluminum as an example. At an upper portion (e.g., as the depth decreases further or as the height increases further) within the multilayer ferroelectric structure, the material composition is that of the ferroelectric layer 370, which as discussed above may be implemented using hafnium oxide that is doped with zirconium as an example.

Figure 8:
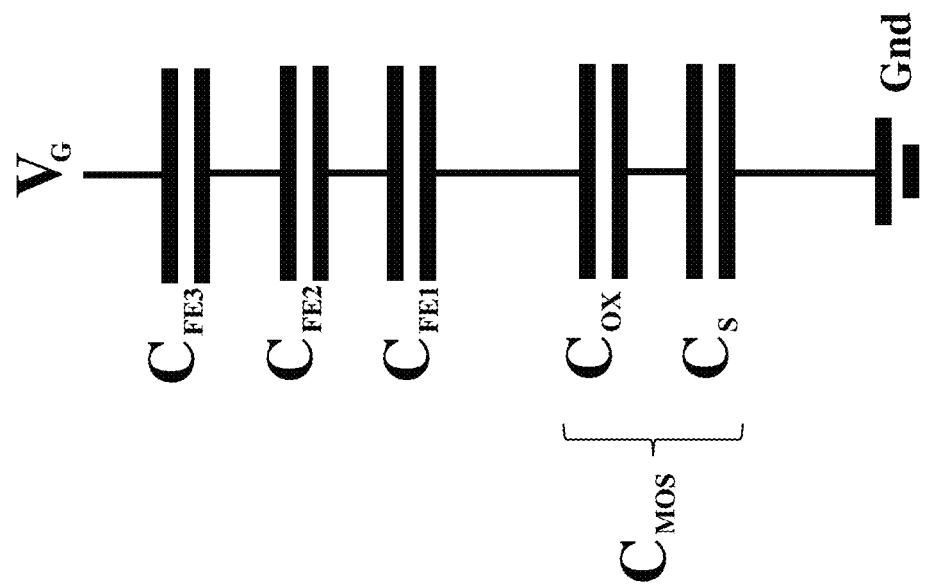
FIG. 8 is a capacitance model of a semiconductor device in accordance with some embodiments.

FIG. 8 illustrates a capacitance model according to embodiments of the present disclosure. The capacitance model corresponds to a portion of the negative capacitance transistor between ground (Gnd) and a gate voltage (Vg) node. A capacitance of the MOS transistor is denoted as $C_{MOS}$, which is made up of a gate oxide capacitance $C_{OX}$ and a depletion region capacitance $C_S$. $C_{OX}$ may be determined by the material compositions and/or the thicknesses of the interfacial layer 280 and the high-k dielectric layer 290, and $C_S$ may be determined by the process conditions and designs of the source/drain regions 230-231 and the channel region 240. The capacitance model further includes $C_{FE1}$, $C_{FE2}$, and $C_{FE3}$, which represent a capacitance of the ferroelectric layers 300, 330, and 370, respectively. $C_{FE1}$, $C_{FE2}$, and $C_{FE3}$ may be determined by the material composition and/or the thickness of the ferroelectric layers 300, 330, and 370, respectively.

In order to optimize the performance of negative capacitance devices, capacitance matching may be needed. For example, the various capacitances discussed above may be adjusted based on factors such as thickness or material composition. Since conventional negative capacitance devices may only have just one ferroelectric layer, capacitance matching flexibility is constrained. In contrast, the present disclosure offers multiple additional element for capacitance matching or tuning. In other words, whereas conventional negative capacitance devices can only rely on $C_{MOS}$ and a single ferroelectric layer for capacitance tuning, the present disclosure can use $C_{FE1}$, $C_{FE2}$, and $C_{FE3}$ as well.

In addition, the interfacial layer (which contributes to $C_{MOS}$) does not provide much capacitance tuning flexibility, since it typically has a lower dielectric constant and may be confined to be within a certain thickness range by design requirements. Likewise, the process conditions and/or source/drain/channel design layer (which also contribute to $C_{MOS}$) may not be flexibly changed either, which further limits the capacitance matching or tuning flexibility of conventional negative capacitance devices. In comparison, the material composition and the thickness of the multiple ferroelectric layers 300, 330, and 370 implemented herein can be flexibly changed depending on the capacitance tuning requirements. If any changes need to be made, for example to any one of the ferroelectric layer for it to achieve specific ferroelectric properties with respect to remanent polarization or coercivity, the material composition and/or the thickness of the other ferroelectric layers may be adjusted accordingly to compensate for the changes. As such, the implementation of the multilayer ferroelectric structure improves capacitance matching.

FIGS. 9A-9C illustrate remanent polarization v.s. coercive field plots of various materials. For example, FIG. 9A is a graph illustrating remanent polarization (Y-axis) v.s. coercive field (X-axis) for hafnium oxide. The hafnium oxide material is associated with a monolithic phase. FIG. 9B is a graph illustrating remanent polarization v.s. coercive field for zirconium oxide. The zirconium oxide has a tetragonal phase. FIG. 9C is a graph illustrating remanent polarization v.s. coercive field for hafnium oxide doped with zirconium. The hafnium oxide doped with zirconium has an orthorhombic phase. As is seen in FIG. 9C, the graph of remanent polarization v.s. coercive field for hafnium oxide doped with zirconium has a hysteresis, shaped similar to an S-curve. This is what is desired for a negative capacitance ferroelectric material, and it may be achieved by capacitance tuning. As discussed above, the multilayer ferroelectric structure provides extra elements for capacitance tuning and thus may facilitate the achievement of the hysteresis.

In addition to the multilayer ferroelectric structure, the present disclosure also includes embodiments where a single layer of ferroelectric material is implemented, but the single layer of ferroelectric material may be formed to have a gradient doping profile. Due to the gradient doping profile, the single layer of ferroelectric layer may still have a varying material composition (e.g., a varying dopant concentration level) as a function of depth or height within the ferroelectric layer.

Figure 10:
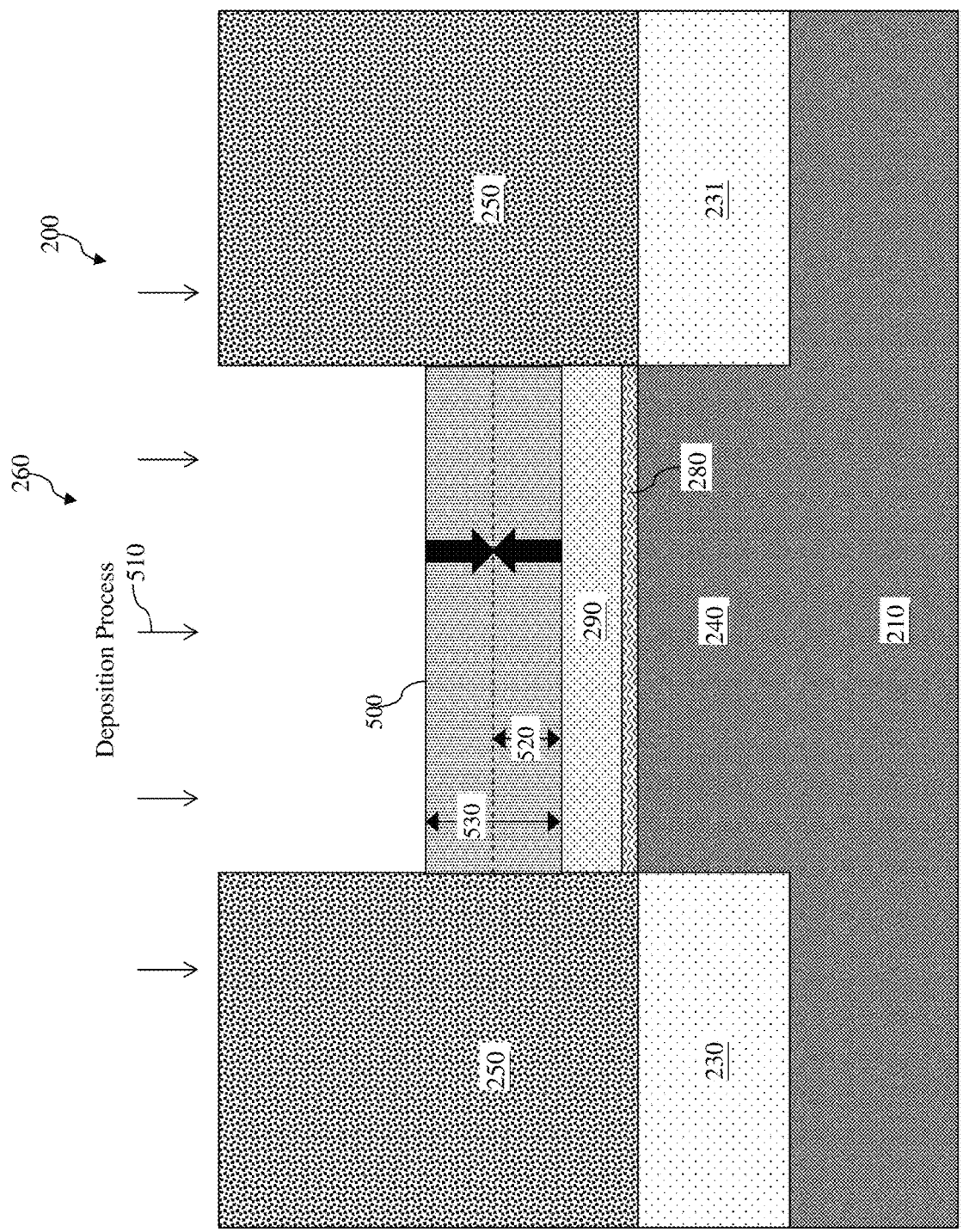
FIGS. 10, 12, 13 and 15 are cross-sectional views of an example semiconductor device in accordance with some embodiments.

In more detail, referring to FIG. 10, a single ferroelectric layer 500 may be formed, rather than the multilayer ferroelectric structure that includes the ferroelectric layers 300, 330, and 370. The single ferroelectric layer 500 may be formed by a deposition process 510. In some embodiments, the deposition process 510 includes an ALD process to help control the precision of the content and thickness of the deposited material.

According to the embodiments of the present disclosure, the deposition process 510 may have a gradient precursor flow. In more detail, the deposition process 510 uses precursors, which may be chemicals in a gas form that react and/or decompose on a substrate surface to produce the desired deposited material. The precursors may include precursors for dopants. By adjusting or configuring the flow of the dopant precursor, the dopant concentration level may be varied. For example, if the flow rate of a dopant precursor is decreased during the deposition, the dopant concentration level may drop in the deposited portion of the ferroelectric layer during that time. Conversely, if the flow rate of a dopant precursor is increased during the deposition, the dopant concentration level may rise in the deposited portion of the ferroelectric layer during that time. If the flow rate of the dopant precursor is zero (e.g., completely shut off), then the dopant concentration level may be substantially zero in the deposited portion of the ferroelectric layer during that time.

In some embodiments, the flow rate of the dopant precursor is configured such that it gradually increases as a function of the height within the ferroelectric layer 500, until a predefined height 520 is reached, and thereafter the flow rate of the dopant precursor is configured such that it gradually decreases as a function of the height within the ferroelectric layer 500. For example, when the ferroelectric layer 500 is first being deposited (e.g., on the upper surface of the high-k dielectric layer 290, or on the upper surface of the interfacial layer 280 if the high-k dielectric layer 290 is absent), the flow rate of the dopant precursor is configured to be very low. In some embodiments, the flow rate of the dopant precursor may be configured to be at zero, or substantially approaching zero. As such, a bottom portion of the ferroelectric layer 500 deposited near the high-k dielectric layer 290 (or the interfacial layer 280) is substantially undoped. In some embodiments, hafnium oxide is deposited as the undoped ferroelectric material of the ferroelectric layer 500.

As the ferroelectric layer 500 continues to be deposited—in other words, as its height or thickness increases—the flow rate of the dopant precursor may gradually increase. This trend is visually represented by the upwardly-pointing arrow within the ferroelectric layer 500. In some embodiments, the flow rate of the dopant precursor may be upwardly adjusted periodically after a predefined amount of time passes. For example, the flow rate may be upwardly adjusted after every X1 number of seconds, where X1 is in a range between about 5 seconds and about 50 seconds. Of course, the increase of the flow rate need not be periodic but may be aperiodic as well.

The flow rate of the dopant precursor is gradually increased until a predefined height 520 is reached within the ferroelectric layer 500. In some embodiments, the height 520 is in a range between about 40% and about 60% of a full height (or thickness) 530 of the ferroelectric layer 500. Thereafter, the flow rate of the dopant precursor is gradually decreased until the end of the deposition process 510. This trend is visually represented by the downwardly-pointing arrow within the ferroelectric layer 500. In some embodiments, the flow rate of the dopant precursor may be downwardly adjusted periodically after a predefined amount of time passes. For example, the flow rate may be downwardly adjusted after every X2 number of seconds, where X2 is in a range between about 5 seconds and about 50 seconds. Of course, the decrease of the flow rate need not be periodic either. In some embodiments, the dopant precursor used includes zirconium. In other embodiments, silicon or aluminum may also be used as the dopant precursor.

Figure 11:
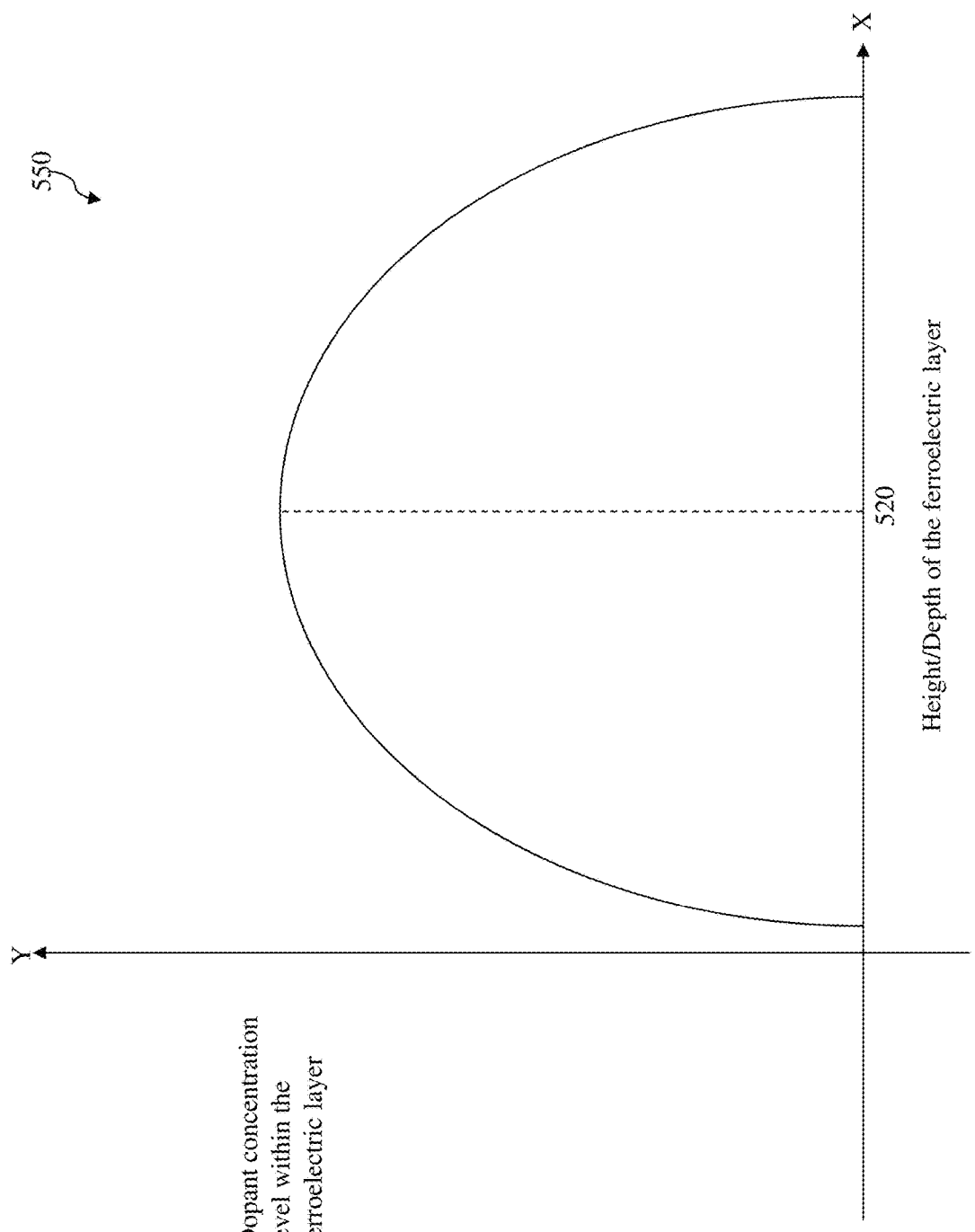
FIGS. 11 and 14 illustrate graphs corresponding to dopant concentration levels in accordance with some embodiments.

Due to the increasing and then decreasing of the flow rate during the deposition process 510, the resulting ferroelectric layer 500 has a dopant profile that varies as a function of the height or depth within the ferroelectric layer. For example, the dopant concentration level may assume a profile similar to a profile shown in FIG. 11. In more detail, FIG. 11 illustrates a graph 550 to visually indicate how the dopant concentration profile varies throughout the ferroelectric layer 500. The graph 550 has an X-axis and a Y-axis. The X-axis represents the height or depth within the ferroelectric layer 500, and the Y-axis represents the dopant concentration level. The Y-axis component of the graph 550 starts off at (or substantially close to) zero when the X-axis component is close to zero, meaning that the dopant concentration level is very close to zero at or near the interface between the ferroelectric layer 500 and the layers 290 or 280 therebelow. As the height increases within the ferroelectric layer 500 (going to the right along the X-axis), the dopant concentration level rises gradually, until the height 520 is reached. In some embodiments, the dopant concentration level at or near the height 520 is in a range between about 20% and about 90%, for example in terms of a molar fraction. Thereafter, the dopant concentration level drops gradually as the height increases within the ferroelectric layer 500, until the end (e.g., the upper surface) of the ferroelectric layer 500.

This unique gradient dopant profile of the ferroelectric layer 500 reduces leakage. For example, since the bottom portion and the top portion of the ferroelectric layer 500 have low (or zero) dopant concentration levels, they substantially resemble undoped hafnium oxide layers. The lack of dopants in these portions of the ferroelectric layer 500 allows them to form good interfaces with the layer therebelow (e.g., the layer 290 or 280) and with the layer thereabove (e.g., the metal gate electrode to be formed).

Meanwhile, the fact that the dopant concentration level varies throughout the ferroelectric layer 500 also provides additional negative capacitance tuning flexibility. For example, though the ferroelectric layer 500 is a single layer, the fact that the dopant concentration level varies within it effectively turns the ferroelectric layer 500 into a multilayer structure resembling the one shown in FIG. 7. In other words, the many portions of the ferroelectric layer 500 (at different height levels) each has its own dopant concentration level, which resembles many sub-layers of a multi-layer ferroelectric structure. In this manner, the ferroelectric layer 500 may be modeled using the capacitance model shown in FIG. 8 as well. In other words, the ferroelectric layer 500 may be viewed as having many different $C_{FEs}$.

Figure 12:
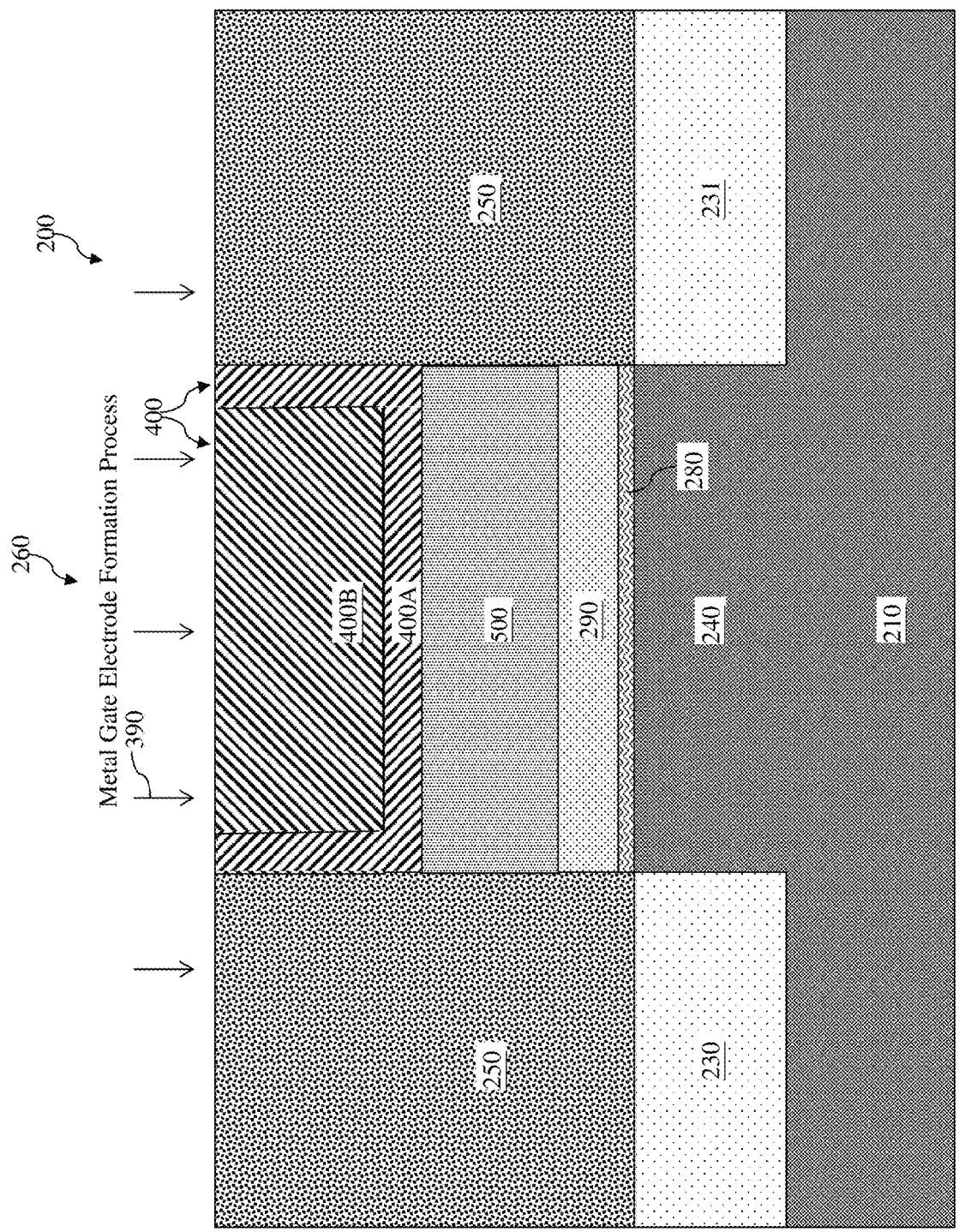

Referring now to FIG. 12, the metal gate electrode formation process 390 discussed may be performed to form the metal gate electrode 400 over the ferroelectric layer 500. For reasons of simplicity and brevity, the details of the metal gate electrode formation process 390 are not repeated herein.

Figure 13:
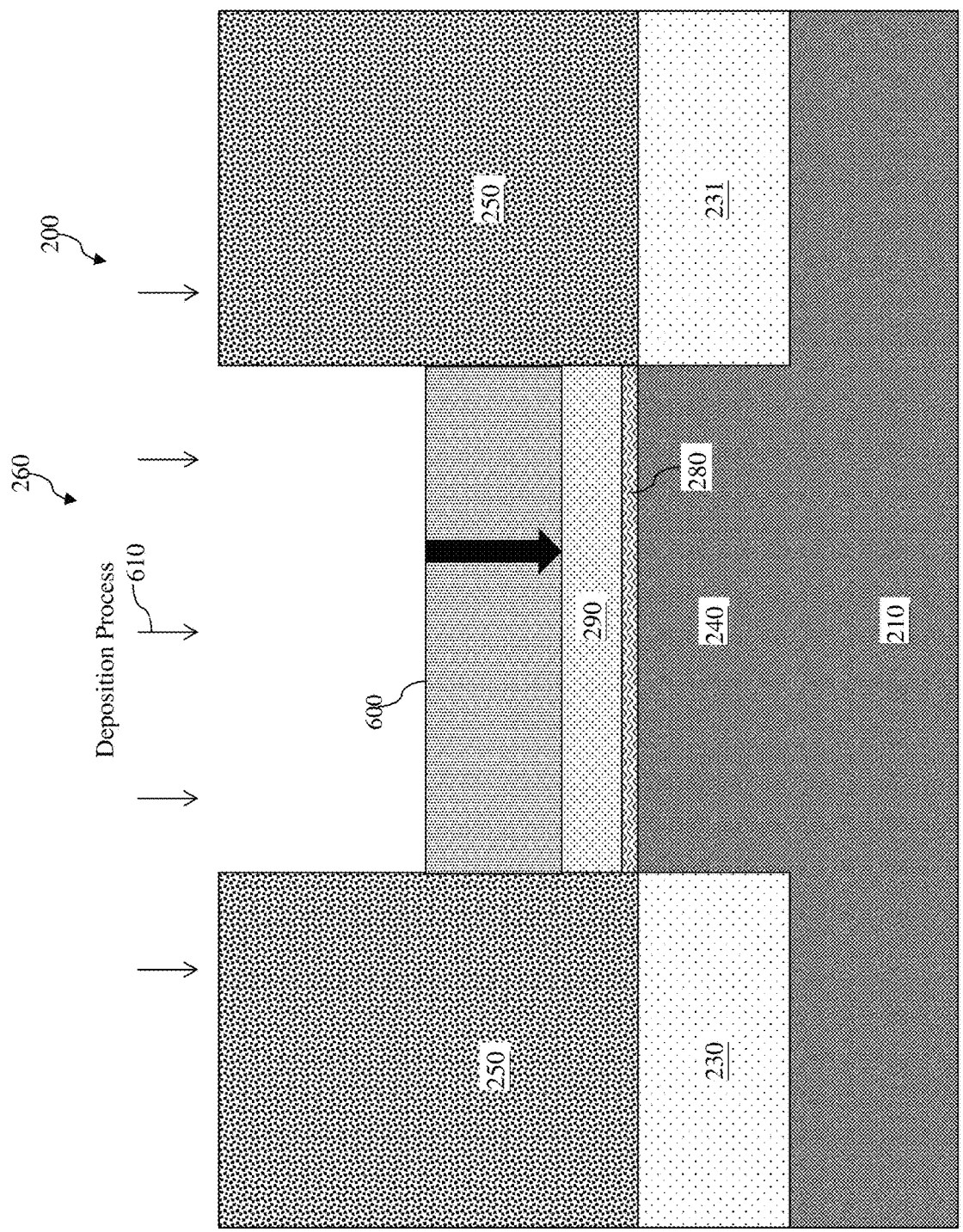

FIG. 13 illustrate another embodiment in which a single ferroelectric layer 600 has a gradient dopant profile. Similar to the deposition process 510 discussed above with reference to FIG. 8, a deposition process 610 used to form the ferroelectric layer 600 may form hafnium as a ferroelectric material and configure zirconium as the dopant precursor, though other ferroelectric materials and other types of dopants (e.g., silicon or aluminum) may also be suitable. Unlike the deposition process 510, however, the deposition process 610 may configure the flow rate of the dopant precursor such that it is the greatest at or near the bottom surface of the ferroelectric layer 500. In some embodiments, the dopant concentration level at or near the bottom surface of the ferroelectric layer 600 is in a range between about 20% and about 90%, for example in terms of a molar fraction. As the height of the deposited ferroelectric layer 600 increases (e.g., as the ferroelectric layer 600 continues to get deposited), the flow rate of the dopant precursor may gradually decrease. This trend of the decreasing flow rate of the dopant precursor is visually represented by the downwardly-pointing arrow in the ferroelectric layer 600.

Figure 14:
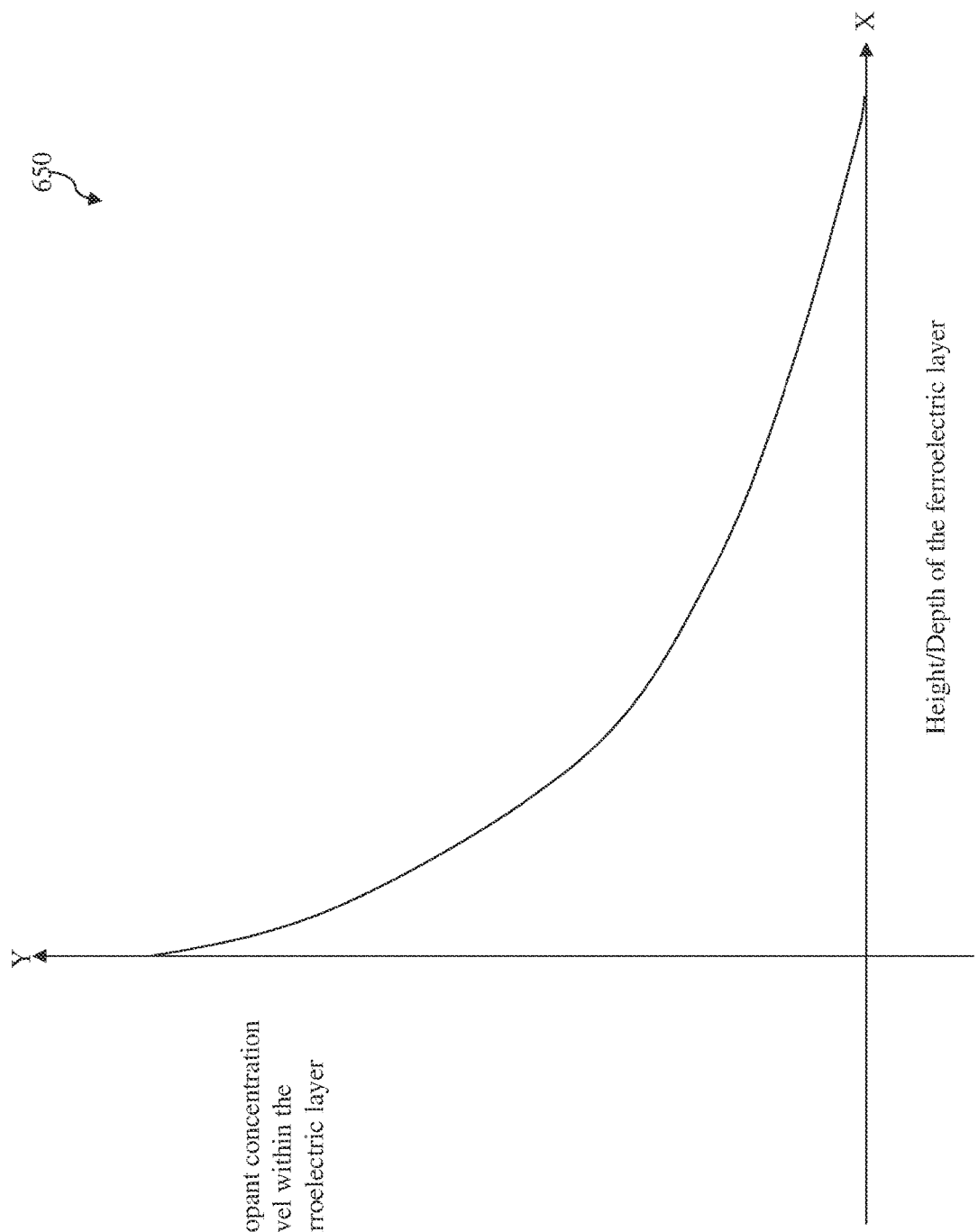

Due to the gradually decreasing flow rate (which may or may not be periodic) during the deposition process 610, the resulting ferroelectric layer 600 also has a dopant profile that varies as a function of the height or depth within the ferroelectric layer. For example, the dopant concentration level may assume a profile similar to a profile shown in FIG. 14. In more detail, FIG. 14 illustrates a graph 650 to visually indicate how the dopant concentration profile varies throughout the ferroelectric layer 600. The graph 650 also has an X-axis that represents the height or depth within the ferroelectric layer 600 and a Y-axis that represents the dopant concentration level. The Y-axis component of the graph 650 starts off at a high level, for example in a range between about 20% and about 90% in terms of molar fraction. This means that the portion of the ferroelectric layer 600 with the greatest dopant concentration level is the bottom portion of the ferroelectric layer 600, which is at or near the interface between the ferroelectric layer 600 and the dielectric layer 290 or 280 therebelow. As the height increases within the ferroelectric layer 600 (going to the right along the X-axis), the dopant concentration level drops gradually, until the end (e.g., the upper surface) of the ferroelectric layer 600 is reached.

This unique gradient dopant profile of the ferroelectric layer 600 also reduces leakage with the metal gate electrode, since the top portion of the ferroelectric layer 600 has a low (or zero) dopant concentration levels. In addition, the strong dopant concentration level at or near the bottom surface of the ferroelectric layer 600 gives the semiconductor device 200 a performance boost, since the region with the greatest dopant concentration level is close to the channel 240. Furthermore, the fact that the dopant concentration level varies throughout the ferroelectric layer 600 also provides additional negative capacitance tuning flexibility, for reasons similar to those discussed above in association with the ferroelectric layer 500.

Figure 15:
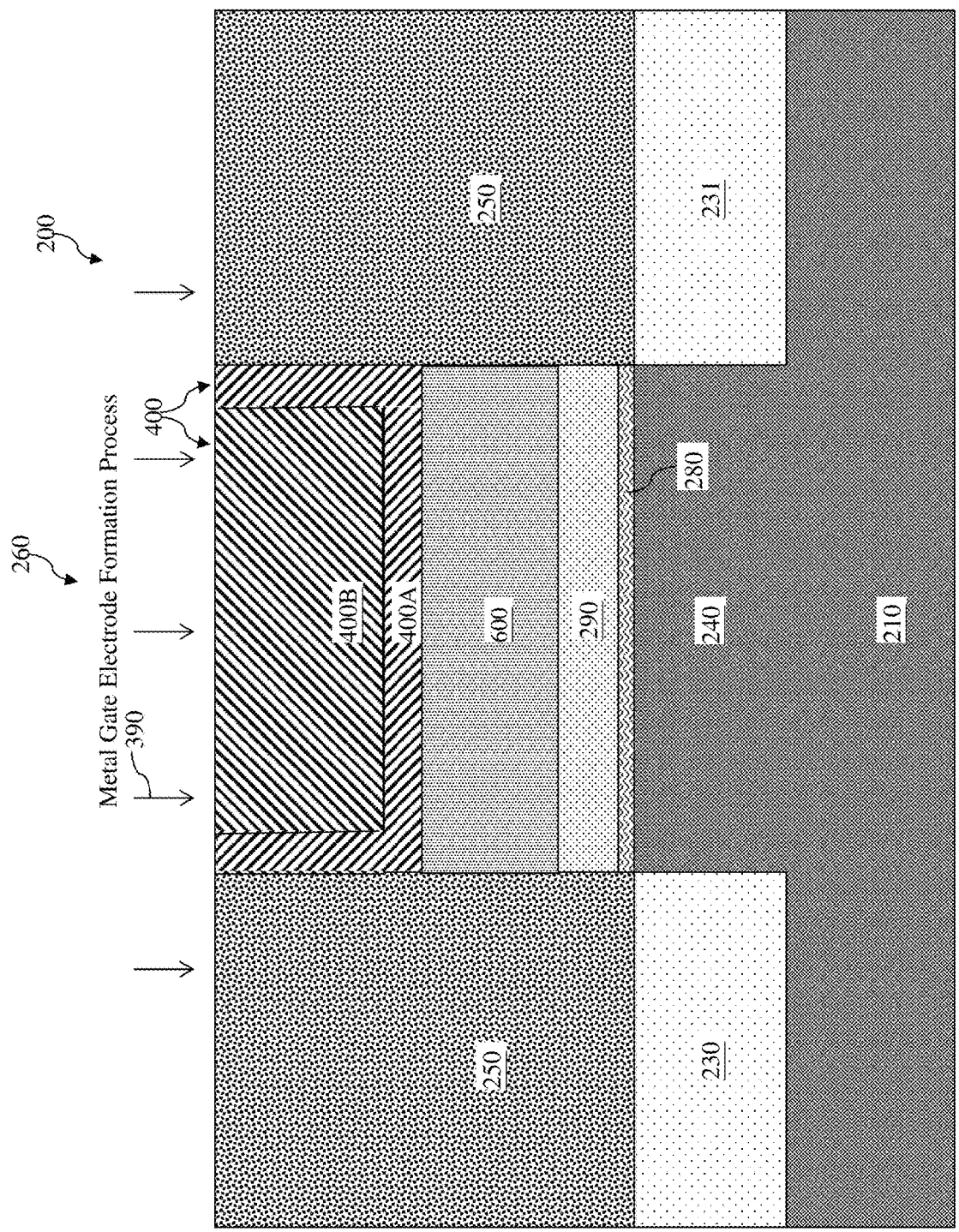

Referring now to FIG. 15, the metal gate electrode formation process 390 discussed may be performed to form the metal gate electrode 400 over the ferroelectric layer 600. For reasons of simplicity and brevity, the details of the metal gate electrode formation process 390 are not repeated herein.

It is understood that the various aspects of the present disclosure apply not only to traditional planar devices, but also to the more recently developed 3-D FinFET transistors as well. An example FinFET device and the fabrication thereof is described in more detail in U.S. Pat. No. 9,711,533, entitled "FINFET DEVICES HAVING DIFFERENT SOURCE/DRAIN PROXIMITIES FOR INPUT/OUTPUT DEVICES AND NON-INPUT/OUTPUT DEVICES AND THE METHOD OF FABRICATION THEREOF", which was filed on Oct. 16, 2015 and issued on Jul. 18, 2017, the disclosure of which is hereby incorporated by reference in its entirety.

Figure 16:
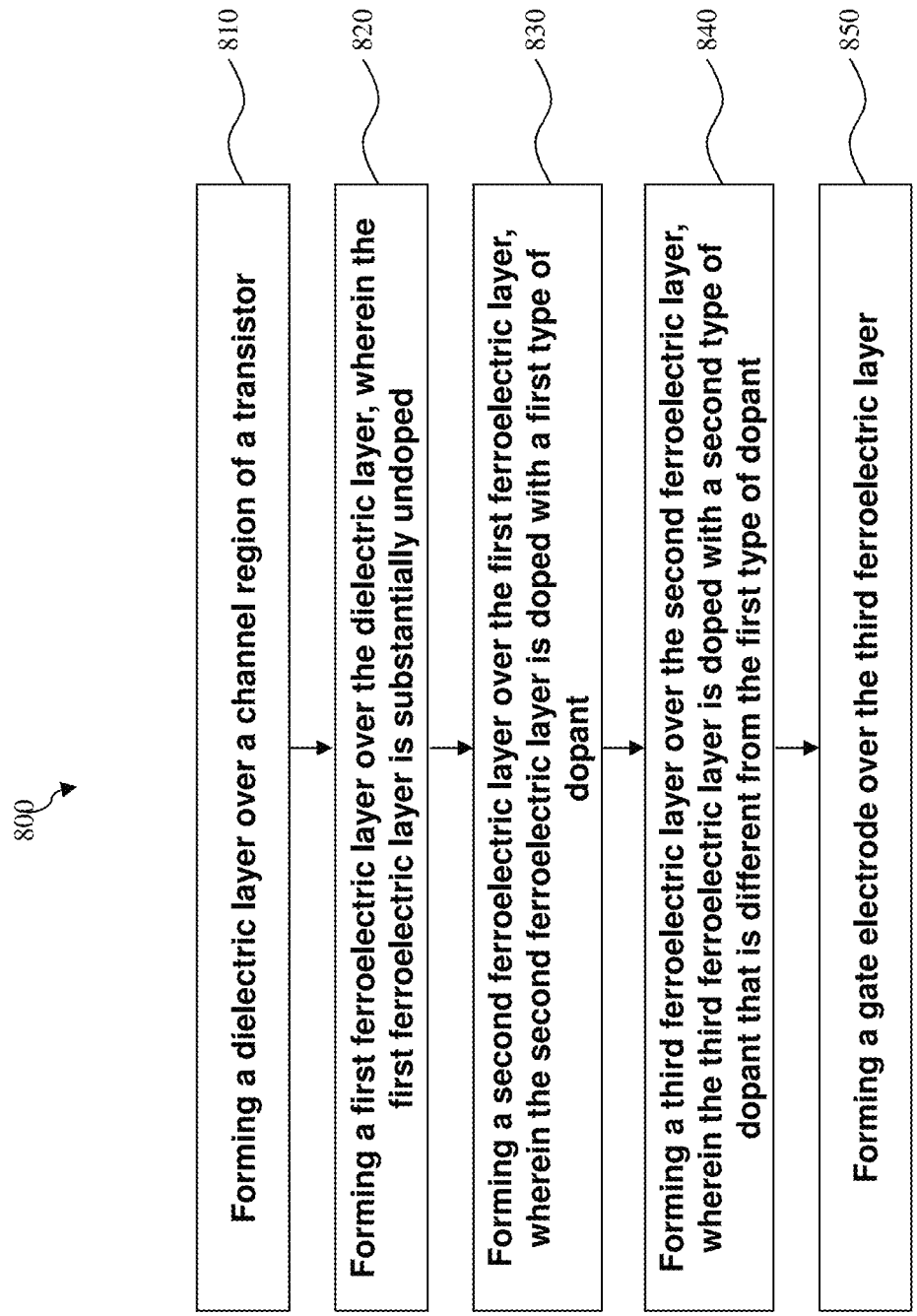
FIGS. 16-17 are flowcharts of example methods for fabricating a semiconductor device constructed in accordance with some embodiments.

FIG. 16 is a flowchart of a method 800 of fabricating a semiconductor device. The method 800 includes a step 810 of forming a dielectric layer over a channel region of a transistor.

The method 800 includes a step 820 of forming a first ferroelectric layer over the dielectric layer. The first ferroelectric layer is substantially undoped.

The method 800 includes a step 830 of forming a second ferroelectric layer over the first ferroelectric layer. The second ferroelectric layer is doped with a first type of dopant.

The method 800 includes a step 840 of forming a third ferroelectric layer over the second ferroelectric layer. The third ferroelectric layer is doped with a second type of dopant that is different from the first type of dopant.

The method 800 includes a step 850 of forming a gate electrode over the third ferroelectric layer.

In some embodiments, the first ferroelectric layer, the second ferroelectric layer, and the third ferroelectric layer are each formed using an atomic layer deposition (ALD) process. In some embodiments, the ALD process is performed at a process temperature in a range between about 200 degrees Celsius and about 400 degrees Celsius.

In some embodiments, the forming the first ferroelectric layer includes forming hafnium oxide with an orthorhombic crystallographic phase Pbc21. In some embodiments, the forming the second ferroelectric layer includes forming aluminum-doped hafnium oxide. In some embodiments, the forming the third ferroelectric layer includes forming zirconium-doped hafnium oxide.

In some embodiments, the forming the first ferroelectric layer is performed using a first thermal budget, the forming the second ferroelectric layer is performed using a second thermal budget that is less than the first thermal budget, and the forming the third ferroelectric layer is performed using a third thermal budget that is less than the second thermal budget.

Figure 17:
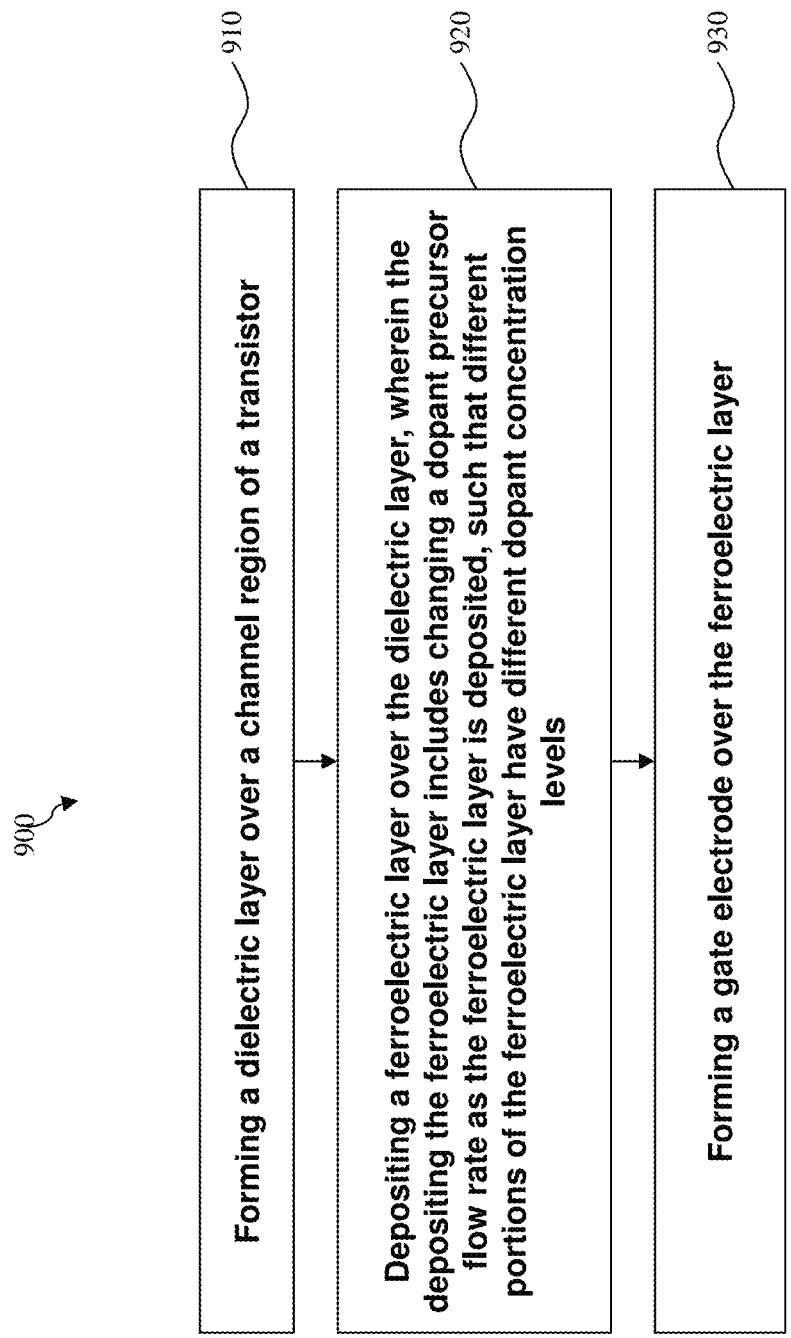

FIG. 17 is a flowchart of a method 900 of fabricating a semiconductor device. The method 900 includes a step 910 of forming a dielectric layer over a channel region of a transistor.

The method 900 includes a step 920 of depositing a ferroelectric layer over the dielectric layer. The depositing the ferroelectric layer includes changing a dopant precursor flow rate as the ferroelectric layer is deposited, such that different portions of the ferroelectric layer have different dopant concentration levels.

The method 900 includes a step 930 of forming a gate electrode over the ferroelectric layer.

In some embodiments, the depositing comprises: increasing the dopant precursor flow rate until the deposited ferroelectric layer reaches a predefined height, and thereafter decreasing the dopant precursor flow rate as the ferroelectric layer continues to be deposited.

In some embodiments, the depositing comprises: decreasing a dopant precursor flow rate throughout a deposition of the ferroelectric layer.

In some embodiments, the changing the dopant precursor flow rate is performed such that: a portion of the ferroelectric layer with a greatest dopant concentration level has a dopant concentration level within a range between about 20% and about 70%; and the portion of the ferroelectric layer is formed as a middle portion of the ferroelectric layer or as a bottom portion of the ferroelectric layer.

In some embodiments, the depositing comprises depositing hafnium oxide that is doped with zirconium.

It is understood that additional processes may be performed before, during, or after the steps 810-850 of the method 800 or before, during, or after the steps 910-930 of the method 900. For example, the method 800 or 900 may include performing a gate replacement process in which a dummy gate structure is removed, and the steps 810-850 or 910-930 are formed thereafter to form a functional gate structure to replace the removed dummy gate structure. As another example, an interconnect structure may be formed to couple various devices into a functional circuit. The interconnection structure may include metal lines distributed in multiple metal layers, contacts to connect the metal lines to devices (such as sources, drains and gates), and vias to vertically connect metal lines in the adjacent metal layers. The formation of the interconnect structure may include damascene process or other suitable procedure. The metal components (metal lines, contacts and vias) may include copper, aluminum, tungsten, metal alloy, silicide, doped polysilicon, other suitable conductive materials, or a combination thereof. Other processes may include processes such as testing and packaging. For reasons of simplicity, these additional steps are not discussed herein in detail.

In summary, the present disclosure forms a negative capacitance capacitor that includes a ferroelectric structure within each the material composition varies as a function of height or depth. In some embodiments, the ferroelectric structure includes multiple distinct ferroelectric layers that each has a different dopant type (some of which may be undoped). In other embodiments, the ferroelectric structure includes a single layer of ferroelectric material, but the single layer of ferroelectric material may have a gradient dopant concentration level. For example, the dopant concentration level may be the highest near a middle portion of the ferroelectric material and drops toward the top and bottom surfaces of the ferroelectric material. As another example, the dopant concentration level may be the highest near a bottom surface of the ferroelectric material and drops toward the top surface of the ferroelectric material.

Based on the above discussions, it can be seen that the present disclosure offers advantages over conventional methods. It is understood, however, that other embodiments may offer additional advantages, and not all advantages are necessarily disclosed herein, and that no particular advantage is required for all embodiments. One advantage is more flexibility with respect to capacitance matching. As discussed above, conventional negative capacitance devices may have a single ferroelectric layer that has a relatively uniform material composition throughout. As such, capacitance matching may be accomplished only by tuning $C_{MOS}$ and/or $C_{FE}$ (where $C_{FE}$ represents the capacitance of that single layer of ferroelectric material). In comparison, the present disclosure provides additional components for capacitance matching either via a distinctly multilayer ferroelectric structure, or via a single layer ferroelectric material that has a gradient dopant profile that varies as a function of its height or depth within the ferroelectric material. Effectively, there are now multiple $C_{FEs}$ present that can be used to tune capacitance. The extra degree of freedom offered by the embodiments of the present disclosure means that parameters such as remanent polarization and/or coercive field of the negative capacitance device may be tuned to achieve optimal performance. Another advantage is improved device performance. For example, the bottom portion or the top portion of the ferroelectric structure of the present disclosure may be configured to have good interfaces with the layers therebelow or thereabove, which helps to reduce leakage. As another example, in embodiments where the ferroelectric layer has a high dopant concentration level near its bottom surface, the close proximity with the channel region offers a performance boost. Other advantages include compatibility with existing fabrication processes and low cost of implementation.

The present disclosure provides a negative capacitance semiconductor device. The negative capacitance semiconductor device includes a substrate. A dielectric layer is disposed over a portion of the substrate. A ferroelectric structure disposed over the dielectric layer. Within the ferroelectric structure: a material composition of the ferroelectric structure varies as a function of a height within the ferroelectric structure. A gate electrode is disposed over the ferroelectric structure.

The present disclosure also provides a method of fabricating a semiconductor device. A dielectric layer is formed over a channel region of a transistor. A first ferroelectric layer is formed over the dielectric layer. The first ferroelectric layer is substantially undoped. A second ferroelectric layer is formed over the first ferroelectric layer. The second ferroelectric layer is doped with a first type of dopant. A third ferroelectric layer is formed over the second ferroelectric layer. The third ferroelectric layer is doped with a second type of dopant that is different from the first type of dopant. A gate electrode is formed over the third ferroelectric layer.

The present disclosure also provides a method of fabricating a semiconductor device. A dielectric layer is formed over a channel region of a transistor. A ferroelectric layer is deposited over the dielectric layer. The depositing the ferroelectric layer includes changing a dopant precursor flow rate as the ferroelectric layer is deposited, such that different portions of the ferroelectric layer have different dopant concentration levels. A gate electrode is formed over the ferroelectric layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
   a substrate;
   a dielectric layer disposed over a portion of the substrate;
   a ferroelectric structure disposed over the dielectric layer, wherein within the ferroelectric structure: a material composition of the ferroelectric structure varies as a function of a height within the ferroelectric structure, wherein the ferroelectric structure includes a plurality of layers that include at least a first layer that has an undoped hafnium oxide material composition, a second layer that has an aluminum-doped hafnium oxide material composition and that is disposed over the first layer, and a third layer that contains hafnium oxide that is doped with zirconium and that is disposed over the second layer, wherein the first layer, the second layer, and the third layer each has a ferroelectric property; and
   a gate electrode disposed over the ferroelectric structure.

2. The semiconductor device of claim 1, wherein each of the plurality of layers of the ferroelectric structure has a different material composition than a rest of the layers of the plurality of layers of the ferroelectric structure.

3. The semiconductor device of claim 1, wherein the dielectric layer is amorphous, wherein the first layer is in direct contact with the dielectric layer, and wherein the first layer has an orthorhombic crystallographic phase Pbc21.

4. The semiconductor device of claim 1, wherein a concentration of the aluminum in the second layer is in a range between about 1% and about 10%.

5. The semiconductor device of claim 1, wherein a concentration of the zirconium in the third layer is in a range between about 20% and about 70%.

6. The semiconductor device of claim 1, wherein:
   a thickness of the first layer is in a range between about 1.5 nanometers and about 8 nanometers;
   a thickness of the second layer is in a range between about 1 nanometer and about 2 nanometers; and
   a thickness of the third layer is in a range between about 1.5 nanometers and about 5 nanometers.

7. The semiconductor device of claim 1, wherein:
   a concentration of the aluminum in the second layer is in a range between about 3% and about 5%; and
   a concentration of the zirconium in the third layer is in a range between about 45% and about 55%.

8. The semiconductor device of claim 1, wherein a bottom surface of the gate electrode is in direct physical contact with an upper surface of the third layer.

9. The semiconductor device of claim 1, wherein the third layer consists of the hafnium oxide that is doped with zirconium.

10. The semiconductor device of claim 1, wherein the dielectric layer has a dielectric constant that is greater than a dielectric constant of silicon oxide, and wherein the semiconductor device further comprises an interfacial layer disposed between the substrate and the dielectric layer, wherein the interfacial layer contains silicon oxide.

11. A method of fabricating a semiconductor device, comprising:

forming a dielectric layer over a channel region of a transistor;

forming a first ferroelectric layer over the dielectric layer, wherein the first ferroelectric layer is substantially undoped, and wherein the forming the first ferroelectric layer is performed using a first thermal budget;

forming a second ferroelectric layer over the first ferroelectric layer, wherein the second ferroelectric layer is doped with a first type of dopant, wherein the forming the second ferroelectric layer is performed using a second thermal budget that is less than the first thermal budget;

forming a third ferroelectric layer over the second ferroelectric layer, wherein the third ferroelectric layer is doped with a second type of dopant that is different from the first type of dopant, and wherein the forming the third ferroelectric layer is performed using a third thermal budget that is less than the second thermal budget; and forming a gate electrode over the third ferroelectric layer.

12. The method of claim 11, wherein the first ferroelectric layer, the second ferroelectric layer, and the third ferroelectric layer are each formed using an atomic layer deposition (ALD) process.

13. The method of claim 12, wherein the ALD process is performed at a process temperature in a range between about 200 degrees Celsius and about 400 degrees Celsius.

14. The method of claim 11, wherein:

the forming the first ferroelectric layer includes forming hafnium oxide with an orthorhombic crystallographic phase Pbc21;

the forming the second ferroelectric layer includes forming aluminum-doped hafnium oxide; and the forming the third ferroelectric layer includes forming zirconium-doped hafnium oxide.

15. The method of claim 14, wherein:

the forming the second ferroelectric layer comprises configuring a concentration of the aluminum in the second ferroelectric layer to be in a range between about 3% and about 5%; and the forming the third ferroelectric layer comprises configuring a concentration of the zirconium in the third ferroelectric layer to be in a range between about 45% and about 55%.

16. The method of claim 11, wherein:

the forming the first ferroelectric layer comprises configuring a thickness of the first ferroelectric layer to be in a range between about 1.5 nanometers and about 8 nanometers;

the forming the second ferroelectric layer comprises configuring a thickness of the second ferroelectric layer to be in a range between about 1 nanometer and about 2 nanometers; and the forming the third ferroelectric layer comprises configuring a thickness of the third ferroelectric layer to be in a range between about 1.5 nanometers and about 5 nanometers.

17. A method of fabricating a semiconductor device, comprising:

forming a dielectric layer over a channel region of a transistor;

depositing a ferroelectric layer over the dielectric layer, wherein the ferroelectric layer has ferroelectric properties, and wherein the depositing the ferroelectric layer includes changing dopant precursors as the ferroelectric layer is deposited, such that different portions of the ferroelectric layer have different dopants, and wherein the depositing comprises depositing at least a first ferroelectric sub-layer with a first thermal budget, a second ferroelectric sub-layer with a second thermal budget lower than the first thermal budget, and a third ferroelectric sub-layer with a third thermal budget lower than the second thermal budget; and forming a gate electrode over the ferroelectric layer.

18. The method of claim 17, wherein the depositing comprises: increasing a dopant precursor flow rate until the deposited ferroelectric layer reaches a predefined height, and thereafter decreasing the dopant precursor flow rate as the ferroelectric layer continues to be deposited.

19. The method of claim 17, wherein the depositing comprises changing a dopant precursor flow rate as the ferroelectric layer is deposited, and wherein the changing the dopant precursor flow rate is performed such that:

a portion of the ferroelectric layer with a greatest dopant concentration level has a dopant concentration level within a range between about 20% and about 70%; and the portion of the ferroelectric layer is formed as a middle portion of the ferroelectric layer or as a bottom portion of the ferroelectric layer.

20. The method of claim 17, wherein the depositing comprises depositing hafnium oxide that is doped with zirconium.

* * * * *